(12) United States Patent
Arahira

(10) Patent No.: US 8,073,337 B2
(45) Date of Patent: Dec. 6, 2011

(54) OPTICAL CLOCK RECOVERY APPARATUS AND METHOD AND BIREFRINGENT MEDIUM

(75) Inventor: Shin Arahira, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 741 days.

(21) Appl. No.: 12/213,050

(22) Filed: Jun. 13, 2008

(65) Prior Publication Data

US 2009/0003835 A1 Jan. 1, 2009

(30) Foreign Application Priority Data

Jun. 28, 2007 (JP) ................................. 2007-170888

(51) Int. Cl.
*H04B 10/04* (2006.01)
(52) U.S. Cl. ............ 398/155; 398/184; 398/201; 372/18
(58) Field of Classification Search ............... 398/81, 398/82, 86–88, 141, 142, 152, 158, 159, 398/154, 155, 27, 201, 184, 192, 193; 372/18, 372/26
See application file for complete search history.

(56) References Cited

U.S. PATENT DOCUMENTS

| 2002/0118422 A1* | 8/2002 | Cao .............................. 359/161 |
| 2004/0207902 A1* | 10/2004 | Koch et al. ..................... 359/301 |
| 2005/0201758 A1* | 9/2005 | Isomura et al. ............... 398/158 |

FOREIGN PATENT DOCUMENTS

| JP | 7-506231 | 7/1995 |
| JP | 9-167870 | 6/1997 |

OTHER PUBLICATIONS

Ono et al. "Optical clock extraction from 10-Gbit/s data pulses by using monolithic mode-locked laser diodes," OFC'95 Technical Digest, ThL4.
Ludwig et al "40 Gbit/s demultiplexing experiment with 10GHz all-optical clock recovery using a modelocked semiconductor laser," Electronics Letters, vol. 32, No. 4, pp. 327-329, Feb. 15, 1996.
Bao et al., "Impact of Saturable Absorption on Performance of Optical Clock Recovery Using a Mode-Locked Multisection Semiconductor Laser," IEEE Journal of Quantum Electronics, vol. 40, No. 9, Sep. 2004, pp. 1177-1185.
Arahira et al., "Retiming and Reshaping Function of All-Optical Clock Extraction at 160 Gb/s in Monolithic Mode-Locked Laser Diode," IEEE Journal of Quantum Electronics, vol. 41, No. 7, Jul. 2005, pp. 937-944.
Brox et al., "Self-Pulsating DFB for 40 GHz Clock-Recovery: Impact of Intensity Fluctuations on Jitter," OFC/2004, Technical Digest MF55.
Yokoyama et al. "Synchronous Injection Locking Operation of Monolithic Mode-Locked Diode Lasers," Optical Review vol. 2, No. 2, 1995, pp. 85-88.

* cited by examiner

*Primary Examiner* — Leslie Pascal
(74) *Attorney, Agent, or Firm* — Rabin & Berdo, P.C.

(57) ABSTRACT

An optical clock signal recovery apparatus includes a mode-locked semiconductor laser that generates an optical pulse train polarized in a first direction. Optical components of the apparatus transmit a component of an input optical signal polarized in a second direction, perpendicular to the first direction, into the mode-locked semiconductor laser while blocking the component of the input optical signal polarized in the first direction, and transmit light exiting the mode-locked semiconductor laser polarized in the first direction, while blocking light exiting the mode-locked semiconductor laser polarized in the second direction. The transmitted exiting light is output as a recovered optical clock signal.

19 Claims, 16 Drawing Sheets

OPTICAL CLOCK RECOVERY APPARATUS AND METHOD AND BIREFRINGENT MEDIUM

BACKGROUND OF THE INVENTION

1. Field of the Invention

The present invention relates to an optical clock recovery apparatus and method useful in, for example, the optical repeaters of a long-haul fiber-optic communication system.

2. Description of the Related Art

Optical communication networks are transporting increasing quantities of data over increasing distances. With the increasing distances come increased problems of optical signal degradation, including waveform degradation in both the temporal and frequency domains. The causes are optical loss, signal-to-noise-ratio degradation owing to the use of multiple optical amplifier stages, and waveform distortion owing to group velocity dispersion. As transmission distances increase, these problems become increasingly apparent.

For these reasons, repeaters are placed at intervals of a few tens of kilometers to a few hundred kilometers along the transmission route to regenerate optical signals by restoring their frequency waveforms and temporal waveforms to their original form.

To regenerate an optical signal, it is necessary to recover a clock signal synchronized with the clock signal that was used to generate the optical signal. The clock signal may be a train of pulses spaced on the time axis at intervals such that the pulse repetition rate is equal to the bit rate of the optical signal. Alternatively, the clock signal may be a sinewave signal with a frequency equal to the bit rate. In either case, the clock signal must be recovered from a degraded version of the optical signal.

The clock signal may be recovered as either an electrical signal or an optical signal. The term 'clock signal' will be used herein to refer to an electrical clock signal. If the clock signal is an optical signal, it will be referred to as an optical clock signal.

The input optical signal from which the clock signal or optical clock signal is recovered may have been generated from an optical clock signal of the pulse train type by modulating the pulse train according to a binary data signal. If an electrical clock signal is recovered, it may be used to recover data from the input optical signal, and then used to drive a semiconductor laser to produce an optical clock signal, which is modulated by the recovered data to regenerate the input optical signal.

One known method of recovering a clock signal from an input optical signal with a known bit rate is to use a photodiode, for example, to convert the input optical signal to an electrical signal and filter the electrical signal with a narrowband electrical filter having a passband centered on or near the bit rate frequency, thereby selecting the frequency component of the electrical signal that matches the bit rate. The selected component is an electrical pulse train or sinewave with a repetition rate or frequency equal to the bit rate, that is, a recovered clock signal.

To meet the increasing demands placed on optical communication networks, much study has focused on methods of transmitting multiple channels in a multiplexed manner, and in particular on optical time division multiplexing (OTDM). In OTDM transmission, the bit rate of the multiplexed signal increases in direct proportion to the number of multiplexed channels. When the bit rate of an OTDM signal becomes as high as forty gigabits per second (40 Gb/s), at the present state of the art, recovery of an electrical clock signal becomes difficult, because the electronic devices used as optical-to-electric conversion elements and as components of electrical filters lack the operating speed necessary to keep up with the bit rates of multiplexed optical transmission.

Accordingly, all-optical clock recovery methods are being studied. These methods bypass optical-to-electrical conversion, and can recover an optical clock signal directly from an OTDM signal having a bit rate too high for the operating speeds of current electronic devices. The basic strategy is to feed the input optical signal into a mode-locked laser that generates optical pulses with a repetition rate approximating the bit rate of the input optical signal. Descriptions of this technique can be found in Japanese Patent Application Publications No. 07-506231 (now Japanese Patent No. 3510247 to Smith) and No. 09-167870 (now Japanese Patent No. 2751903 to Yano), and in the following publications:

Ono et al., 'Optical clock extraction from 10-Gbit/s data pulses by using monolithic mode-locked laser diodes', *OFC'95 Technical Digest*, ThL4.

Ludwig et al., '40 Gbit/s demultiplexing experiment with 10 GHz all-optical clock recovery using a modelocked semiconductor laser', *Electronics Letters*, Vol. 32, No. 4, pp. 327-329, 1996

Bao et al., 'Impact of Saturable Absorption on Performance of Optical Clock Recovery Using a Mode-Locked Multisection Semiconductor Laser' *IEEE Journal of Quantum Electronics*, Vol. 40, No 9, pp. 1177-1185, 2004

In a first method of all-optical clock recovery, described by Smith, a mode-locked laser of the fiber type is used. The optical pulses generated by lasing action are modulated by cross phase modulation (XPM) with the input optical signal, due to the optical Kerr effect, as they travel back and forth in the optical fiber. This causes the laser pulses to synchronize with the optical pulses in the input optical signal, so that when they exit the laser they form a recovered optical clock signal.

In a second method of all-optical clock recovery, described by Yano, Ono et al., Ludwig et al., and Bao et al., a passive mode-locked semiconductor laser employing a saturable absorber is used. The optical absorption coefficient of the saturable absorber changes in synchronization with the optical pulses of the input optical signal. As a result, the pulses of laser light generated in the optical resonator cavity of the passive mode-locked semiconductor laser synchronize with the optical pulses in the input optical signal and become a recovered optical clock signal. Recovery of a 160-Gb/s optical clock signal by use of a passive mode-locked semiconductor laser that generates an optical pulse train with a repetition frequency of 160 GHz has been reported by Arahira (the present inventor) and Ogawa in 'Retiming and Reshaping Function of All-Optical Clock Extraction at 160 Gb/s in Monolithic Mode-Locked Laser Diode', *IEEE Journal of Quantum Electronics*, Vol. 41, No. 7, pp. 937-944, 2005, indicating that methods using a passive mode-locked semiconductor laser are useful for all-optical recovery of clock signals from ultra-high-speed optical pulse signals, such as OTDM signals.

In a third method of all-optical clock recovery (described by Brox et al. in 'Self-Pulsating DFB for 40 GHz Clock-Recovery: Impact of Intensity Fluctuations on Jitter', *OFC 2004 Technical Digest MF55*), the optical signal is input to a self-pulsating laser, causing it to generate optical pulses at a repetition frequency synchronized to the bit rate frequency of the input optical signal. Brox et al. use a distributed feedback (DFB) laser with multiple electrodes, which allows the repetition frequency of the optical pulses to be varied over a wide range by varying the driving conditions of the electrodes.

A first major problem with the three methods described above is that in addition to a mode-locked laser or a self-pulsating laser they require a wavelength filter with a pass-band positioned at the lasing wavelength of the laser to remove the wavelength component of the input optical signal from the optical output of the mode-locked laser or self-pulsating laser, as noted by Bao et al. in the second paragraph in the left column of page 3 of the cited reference, and by Brox et al. in the second column of page 2 of the cited reference.

The problems that arise if the wavelength component of the input optical signal is not removed from the optical output of the laser will be explained in the detailed description of the present invention, with reference to experimental results. The need for an optical wavelength filter can also be readily inferred from the Yano patent. Although no wavelength filter is shown in FIG. 2 of this patent document, the input light injected into the laser propagates in the same direction as the light output by the lasing action of the laser, so the output laser light must be separated from the spent input light. In FIG. 3A in the patent to Smith, a wavelength division multiplexing (WDM) filter is inserted for the apparent purpose of preventing unwanted wavelength components of the input optical signal from being included in the recovered optical clock signal.

The need for an optical wavelength filter increases the size, number of components, and cost of an all-optical clock recovery device employing any of the above methods. A more basic problem is that if the input optical signal has the same or nearly the same wavelength as the recovered clock signal, then no wavelength filter can exclude unwanted input optical signal components from the recovered optical clock signal. With a mode-locked laser, a further problem is that if the input optical signal and the recovered optical clock signal have the same wavelength, or nearly the same wavelength, the operation of the mode-locked laser becomes unstable due to optical injection locking, making it impossible to recover the optical clock signal.

A second major problem with the three methods above is that the optical clock signal recovery apparatus will not operate properly unless special care is taken. If a mode-locked laser is used, it must be driven so as to maintain a fixed relationship between the wavelength of the input optical signal and the wavelength of the recovered optical clock signal in order to control optical injection locking, as explained in paragraphs 0028 to 0037 of the Yano publication. Effective control of optical injection locking enables the frequency and phase of the lasing mode of the mode-locked laser to be controlled, but maintaining the stability of this state is extremely difficult with present control techniques.

When the wavelength of the input optical signal is so close to the wavelength of the recovered optical clock signal as to be inseparable by a wavelength filter, the mode-locked laser can easily slip between the optical injection locked state, in which the wavelength and phase of the mode-locked semiconductor laser are pulled toward and locked at the wavelength and phase of the input optical signal, and the non-locked state in which there is no fixed phase relationship between the input optical signal and the laser light. As a result, random optical beats arise between the lasing spectrum of the mode-locked semiconductor laser and the wavelength components of the input optical signal, making recovery of a stable optical clock signal difficult.

If optical injection locking could be controlled, it could be used to recover an optical clock signal, but there would still be practical problems, because the lasing spectrum of the mode-locked semiconductor laser would differ considerably, depending on whether the input optical signal was present or absent, as shown by Yokoyama et al. in FIG. 6 in the article 'Synchronous Injection Locking Operation of Monolithic Mode-Locked Diode Lasers', *Optical Review* Vol. 2, No. 2, pp. 85-88, 1995. In this figure the lasing spectrum of the mode-locked semiconductor laser is concentrated around 1590 nanometers (nm) when the input optical signal is absent, but widens by being pulled down to the vicinity of 1585 nm when an input optical signal is present.

In the example described by Yokoyama et al. the input optical signal is an optical pulse train, so the conditions do not completely match the conditions under which an optical clock signal is normally recovered, but the mode-locked laser operates by the same principle, so the same change in the lasing spectrum of the mode-locked semiconductor laser can be expected to occur in optical clock recovery from actual input optical signals.

It follows that to recover an optical clock signal by use of optical injection locking, it would be necessary to take the changes in the lasing spectrum of the mode-locked semiconductor laser due to the input optical signal into account in the design of the mode-locked semiconductor laser. The changes in the spectrum of the optical clock signal recovered by a mode-locked semiconductor laser also depend on the wavelength of the input optical signal, and this too would have to be considered in the design of the mode-locked semiconductor laser.

A further problem with the use of optical injection locking is that if the input optical signal had a chirped frequency characteristic, the chirp would be transferred to the laser light output by the mode-locked semiconductor laser, that is, the recovered optical clock signal. The wavelength spectrum of the recovered optical clock signal would then include unwanted variations acquired from the chirped frequency characteristic of the input optical signal.

When optical injection locking occurs, at least one of the longitudinal lasing mode components of the mode-locked semiconductor laser matches the wavelength of the input optical signal. That is, there is a fixed correlation between the wavelength of the input optical signal and the wavelength of the recovered optical clock signal. More precisely, the wavelengths of the light output by the longitudinal lasing modes of the mode-locked semiconductor laser are limited to a group of wavelengths separated from the wavelength of the input optical signal by integer multiples of a wavelength equivalent to the repetition rate of the optical pulse train output from the mode-locked semiconductor laser.

The wavelengths of the longitudinal lasing modes of the mode-locked semiconductor laser are therefore not independent of the wavelength of the input optical signal. In the design of a practical optical clock signal recovery apparatus, the wavelength of the input optical signal and the wavelength of the recovered optical clock signal cannot be set arbitrarily. This constrains the design of practical optical clock signal recovery apparatus.

This constraint poses particular problems in systems in which the use of wavelength division multiplexing is contemplated. A specific problem is that optical injection locking may occur between the input optical signal and a longitudinal lasing mode of the mode-locked semiconductor laser that differs from the longitudinal lasing mode with maximum spectral intensity. In this case, if the wavelength of the input optical signal matches a particular grid wavelength, the center wavelength of the recovered optical clock signal, that is, the wavelength of the longitudinal mode with the maximum spectral intensity, will not in general match this particular grid wavelength, or any other wavelength in the WDM grid. That is, the wavelength of the recovered optical clock signal will belong to a wavelength grid different from the wavelength grid used in the WDM system, making the optical clock signal unusable in the WDM communication system without further alteration.

Even if optical clock signal recovery is carried out with the intensity of the input optical signal reduced to a level at which optical injection locking does not occur, the spectral characteristics of the recovered optical clock signal will still vary depending on the wavelength of the input optical signal. Further details will be given later, but the reason for this problem is that even without optical injection locking, a multiple modulation effect occurs due to optical resonance effects in the mode-locked semiconductor laser, and as a result, an effective modulation intensifying effect occurs. This problem becomes pronounced when the wavelength of the input optical signal approaches the lasing wavelength of the mode-locked semiconductor laser, making it susceptible to optical resonance effects. When this happens, a slight change in the wavelength of the input optical signal can produce large changes in the characteristics of the recovered optical clock signal, including its temporal jitter, pulse width, lasing spectrum, and so on. These problems must be worked around in the design of a practical optical clock signal recovery apparatus using a mode-locked semiconductor laser.

In consideration of optical injection locking and optical resonance effects, the relationship between the lasing spectrum of a mode-locked semiconductor laser and the wavelength of the input optical signal requires close attention in the design of a practical optical clock signal recovery apparatus. Besides adding complications to the design of the optical clock signal recovery apparatus, these considerations can restrict its range of use. An example is the restriction arising from the wavelength grid in a WDM system as described above.

The major problems of the conventional art are accordingly the difficulty of recovering an optical clock signal that does not include components of the input optical signal, and the tendency of the wavelength spectrum of the recovered optical clock signal to change when the wavelength of the input optical signal changes. Because of these problems, with the known types of optical clock signal recovery apparatus it is difficult to recover an optical clock signal that does not include components of the input optical signal and has the desired clock frequency, that is, has a repetition rate that matches the bit rate of the input optical signal, despite changes in the wavelength of the input optical signal.

SUMMARY OF THE INVENTION

After diligent research into the problems described above, the inventor found that if the direction of polarization of the input optical signal was perpendicular to the direction of polarization of the recovered optical clock signal, then the recovered optical clock signal could be separated from the components of the input optical signal on the basis of their polarization difference, making it possible to recover an optical clock signal that did not include components of the input optical signal.

The inventor also found that it was possible to recover an optical clock signal with spectral characteristics that did not change with variations in the wavelength of the input optical signal by structuring the mode-locked semiconductor laser used in the optical clock signal recovery process in such a way as not to exhibit multiple modulation effects and optical injection effects with respect to the input optical signal components.

In one embodiment, the present invention provides an optical clock signal recovery apparatus comprising a mode-locked semiconductor laser, an optical input section, and an optical output section. The mode-locked semiconductor laser has a saturable absorption region and a gain region, and outputs a train of pulses of laser light.

The optical input section feeds a first linearly polarized component of an input optical signal received from an external source to the end of the mode-locked semiconductor laser at which the saturable absorption region is located. The optical input section includes a first polarization-dependent optical isolator that receives the input optical signal and outputs the first linearly polarized component, which is polarized in a direction perpendicular to the direction of polarization of the laser light.

The optical output section receives an optical pulse train output from the mode-locked semiconductor laser and outputs a recovered optical clock signal. The optical output section includes a second polarization-dependent optical isolator that receives the optical pulse train from the mode-locked semiconductor laser and outputs a second linearly polarized component having a polarization direction parallel to the polarization direction of the laser light generated by mode-locked semiconductor laser. The output component is the recovered optical clock signal.

The invention also provides an optical clock signal recovery apparatus having a mode-locked semiconductor laser as described above and an optical input-output section that combines the functions of the above input section and output section.

In one embodiment, the input-output section comprises a polarization-dependent optical circulator and a Faraday rotator that rotates the plane of polarization of linearly polarized input light through an angle of 45 degrees. The polarization-dependent optical circulator feeds the input optical signal through the Faraday rotator into the end of the mode-locked semiconductor laser at which the saturable absorption region is located. The optical pulse train generated by the mode-locked semiconductor laser is fed through the Faraday rotator to the polarization-dependent optical circulator and output as the recovered optical clock signal.

In another embodiment, the input-output section comprises a first polarization-dependent optical circulator, an optical coupler, and a second polarization-dependent optical circulator. The input optical signal passes through the first polarization-dependent optical circulator and optical coupler into the mode-locked semiconductor laser. The optical pulse train generated by the mode-locked semiconductor laser passes through the optical coupler and the second polarization-dependent optical circulator and is output as the recovered optical clock signal.

The invention also provides a birefringent medium, which may be placed ahead of the input section or the input-output section to adjust the plane of polarization of the input optical signal. The birefringent medium has a length L in the direction of propagation of the input optical signal such that the differential group delay of the input optical signal in the birefringent medium is an integer multiple of the bit period. That is, $$(\Delta n/c)L = n \times T_{bit\text{-}rate}$$

where $\Delta n$ is the difference between the refractive index of the ordinary ray and the refractive index of the extraordinary ray in the birefringent medium, c is the speed of light in a vacuum, n is an integer greater than zero, and $T_{bit\text{-}rate}$ is the minimum spacing of the light pulses constituting the pulse train input to the birefringent medium.

When this birefringent medium is placed in front of the input section of an optical clock signal recovery apparatus with separate input and output sections, the crystal axes of the birefringent medium are oriented at angles of 45 degrees with respect to the polarization direction of the polarized waves transmitted by the first polarization-dependent optical isolator.

In the embodiment in which the input-output section comprises a polarization-dependent optical circulator and a Faraday rotator, the polarization-dependent optical isolator has first, second, and third ports. Light entering through the first port exits from the second port, and light entering through the second port exits from the third port. The birefringent medium is placed in front of the first port. The crystal axes of the birefringent medium are oriented at angles of 45 degrees with respect to the polarization direction of the polarized waves transmitted from the first port to the second port. The recovered optical clock signal is output from the third port.

In the embodiment in which the input-output section comprises a first polarization-dependent optical circulator, an optical coupler, and a second polarization-dependent optical circulator, the crystal axes of the birefringent medium are oriented at angles of 45 degrees with respect to the polarization direction of the polarized waves transmitted by the first polarization-dependent optical isolator.

In the mode-locked semiconductor laser used in the above optical clock signal recovery apparatus, the saturable absorbing region is formed as a bulk semiconductor active layer and the gain region is formed as a semiconductor active layer with an unstrained quantum structure or a compressively strained quantum structure. Alternatively, the saturable absorbing region is formed as a semiconductor active layer with a tensile strained quantum structure and the gain region is formed as a semiconductor active layer with an unstrained quantum structure or a compressively strained quantum structure.

The invention also provides an optical clock signal recovery method including the steps of receiving an input optical signal, generating an optical pulse train, and generating a recovered optical clock signal. These steps are executed by the novel apparatus described above. Receiving the input optical signal includes input of the input optical signal to the mode-locked semiconductor laser with its direction of polarization perpendicular to the direction of polarization of the light produced by lasing. The mode-locked semiconductor laser then generates the optical pulse train. Generating the recovered optical clock signal includes transmitting only the wave component of the optical pulse train that is polarized in a direction parallel to the direction of polarization of the laser light produced in the mode-locked semiconductor laser.

In the novel apparatus, although input optical signal components remain present in the optical pulse train output from the mode-locked semiconductor laser, these remaining components are polarized in a direction perpendicular to the polarization direction of the recovered optical clock signal. Accordingly, these remaining components are not transmitted by the second polarization-dependent optical isolator, or are not transmitted by the polarization-dependent optical circulator after exiting the mode-locked semiconductor laser and being rotated by the Faraday rotator. Accordingly, no wavelength filter is needed to remove unwanted components from the recovered optical clock signal.

Moreover, the second polarization-dependent optical isolator, or the combination of the polarization-dependent optical circulator and the Faraday rotator, can reject remaining input optical signal components even when the wavelength of the input optical signal is close to or equal to the wavelength of the recovered optical clock signal, thereby functioning as an analyzer, a role that could not be fulfilled by a wavelength filter.

The first polarization-dependent optical isolator, or the combination of the polarization-dependent optical circulator and the Faraday rotator, also functions as an analyzer by ensuring that the input optical signal that enters the mode-locked semiconductor laser is polarized in a direction perpendicular to the direction of polarization of the laser light generated by the mode-locked semiconductor laser.

A further effect of the first polarization-dependent optical isolator, or the combination of the polarization-dependent optical circulator and the Faraday rotator, is to ensure that laser light emitted by the mode-locked semiconductor laser in the direction toward the first polarization-dependent optical isolator or the Faraday rotator is not returned to the source of the input optical signal and will not affect the operation of the transmitting device that produced the input optical signal.

An effect of the use of an input-output section including a polarization-dependent optical circulator and a Faraday rotator is that the optical clock signal recovery apparatus becomes more compact than an optical clock signal recovery apparatus having an input section and an output section at opposite ends of the mode-locked semiconductor laser. When the optical clock signal recovery apparatus is used as a component of an optical communication system, the configuration with an input-output section also reduces optical assembly costs.

An effect of the birefringent medium is that the optical clock signal can be recovered consistently regardless of the polarization state of the input optical signal.

Use of a bulk semiconductor active layer or a semiconductor active layer having a tensile strained quantum structure as the saturable absorber of the mode-locked semiconductor laser has the effect that an optical absorption coefficient modulation effect is exhibited by absorption saturation with respect both to the laser light generated in the mode-locked semiconductor laser and the input optical signal, which is polarized in a direction perpendicular to the direction of polarization of the laser light. The optical absorption coefficient modulation effect with respect to the laser light triggers the mode-locked operation. The optical absorption coefficient modulation effect with respect to the input optical signal causes a recovered optical clock signal to be generated.

Use of a semiconductor active layer with an unstrained quantum structure or a compressively strained quantum structure has the effect that the optical gain depends strongly on the polarization direction, so that the lasing threshold gain is much larger for one polarized wave than for the other polarized wave. As a result, the polarization of the laser light remains stable even when the input optical signal is present, and never matches the polarization direction of the input optical signal. As a result it is always possible to generate a recovered optical clock signal that is polarized perpendicular to the polarization direction of the input optical signal.

Due to the above structures of the saturable absorbing region and the gain region, the mode-locked semiconductor laser does not exhibit multiple modulation effects or optical injection effects. As a result, even if the wavelength of the input optical signal is changed, the spectral characteristics of the recovered optical clock signal do not change.

If the length L of the birefringent medium satisfies the condition stated above $((\Delta n/c)L = n \times T_{bit-rate})$, then regardless of the state of polarization of the input optical signal, it is always possible to provide the mode-locked semiconductor laser with an input optical signal polarized in a direction perpendicular to the direction in which the lasing is polarized, so that the optical clock signal can be recovered consistently.

Accordingly, the novel optical clock signal recovery apparatus generates a recovered optical clock signal that does not include unwanted input optical signal components, and has a spectral characteristic that does not change when the wavelength of the input optical signal changes. The recovered optical clock signal has a repetition frequency matching the bit rate frequency of the input optical signal, and does not include components polarized in the same direction as the input optical signal.

These effects are also obtained from the novel optical clock signal recovery method.

BRIEF DESCRIPTION OF THE DRAWINGS

In the attached drawings:

FIGS. 9 to 11 show exemplary pulse trains and polarization directions illustrating the operation of the optical clock signal recovery apparatus in the first, second, and third embodiments;

DETAILED DESCRIPTION OF THE INVENTION

Figure 1:
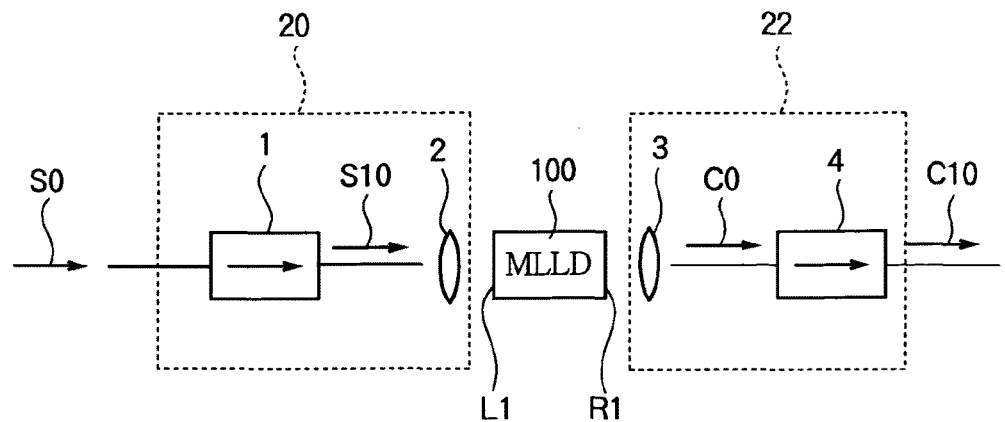
FIG. 1 is a block diagram schematically illustrating the structure of an optical clock signal recovery apparatus according to a first embodiment of the invention.

Embodiments of the invention will now be described with reference to the attached drawings, in which like elements are indicated by like reference characters. The drawings show the embodiments schematically; the invention is not limited to the illustrated configurations or positional relationships, or to the exemplary devices and operating conditions mentioned in the description.

First Embodiment

Referring to FIG. 1, the first embodiment is an optical clock signal recovery apparatus comprising a first polarization-dependent optical isolator 1 and a coupling lens 2 forming an optical input section 20, a coupling lens 3 and a second polarization-dependent optical isolator 4 forming an optical output section 22, and a mode-locked semiconductor laser, referred to below as a mode-locked laser diode (MLLD) 100, disposed between the optical input section 20 and the optical output section 22.

In the optical input section 20, the first polarization-dependent optical isolator 1 passes an input optical signal S0 received from an optical channel (not shown) through the coupling lens 2 to the mode-locked laser diode 100, and prevents light output from the mode-locked laser diode 100 from returning on the same optical channel. In the optical output section 22, the second polarization-dependent optical isolator 4 outputs the light generated by lasing in the mode-locked laser diode 100 as a recovered optical clock signal C10, and blocks the component of the input optical signal S0 that propagates through the first polarization-dependent optical isolator 1 and mode-locked laser diode 100.

The mode-locked laser diode 100 is an optical resonator with a left facet L1 facing the optical input section 20 and a right facet R1 facing the optical output section 22.

The input optical signal S0 entering the optical input section 20 is an optical signal with a bit rate of $f_{bit\text{-}rate}$ measured in bits per second (bits/s) or herz (Hz), comprising pulses with a minimum spacing $T_{bit\text{-}rate}$ (measured in seconds) equal to the reciprocal of the bit rate ($1/f_{bit\text{-}rate}$).

The optical signal S10 output from the first polarization-dependent optical isolator 1 toward the coupling lens 2 is polarized in a plane perpendicular to the plane of polarization of the laser light generated by the mode-locked laser diode 100. Optical signal S10 becomes one component of the optical signal C0 output by the mode-locked laser diode 100 through the coupling lens 3 toward the second polarization-dependent optical isolator 4, the other component of optical signal C0 being the recovered optical clock signal C10.

The mode-locked laser diode 100 may be either a passive mode-locked semiconductor laser or an active mode-locked semiconductor laser. In the following description, the mode-locked laser diode 100 is a passive mode-locked semiconductor laser. When the mode-locked laser diode 100 exhibits mode-locked operation it generates and outputs an optical pulse train with a pulse repetition rate approximately equal to the bit rate of the input optical signal S0. Approximately equal means that the pulse repetition rate is close enough to the bit rate for frequency locking to occur.

The mode-locked laser diode 100 includes at least a gain region that produces lasing operation and a saturable absorption region that operates as an optical switch to produce mode-locked operation. The saturable absorption region is disposed near the left facet L1 of the mode-locked laser diode 100, with no active region left between the saturable absorption region and the left facet L1.

The gain region includes a semiconductor active layer with a quantum structure that is either unstrained or compressively strained. 'Quantum structure' is used herein as a generic term for a quantum well structure, quantum line structure, or quantum dot structure.

The saturable absorption region, also referred to below as the saturable absorber, includes either a bulk semiconductor active layer or a semiconductor active layer with a tensile strained quantum structure. In the latter case, the amount of tensile strain is selected to enable either the optical signal S10 or the laser light generated in the mode-locked laser diode 100 to produce an optical absorption coefficient modulation effect in the saturable absorption region.

The mode-locked laser diode 100 preferably has a multiple-electrode structure. In order to maintain a practical degree of operational stability and provide a low-cost optical clock signal recovery apparatus, the mode-locked laser diode 100 is preferably an integrated semiconductor device.

Figure 2:
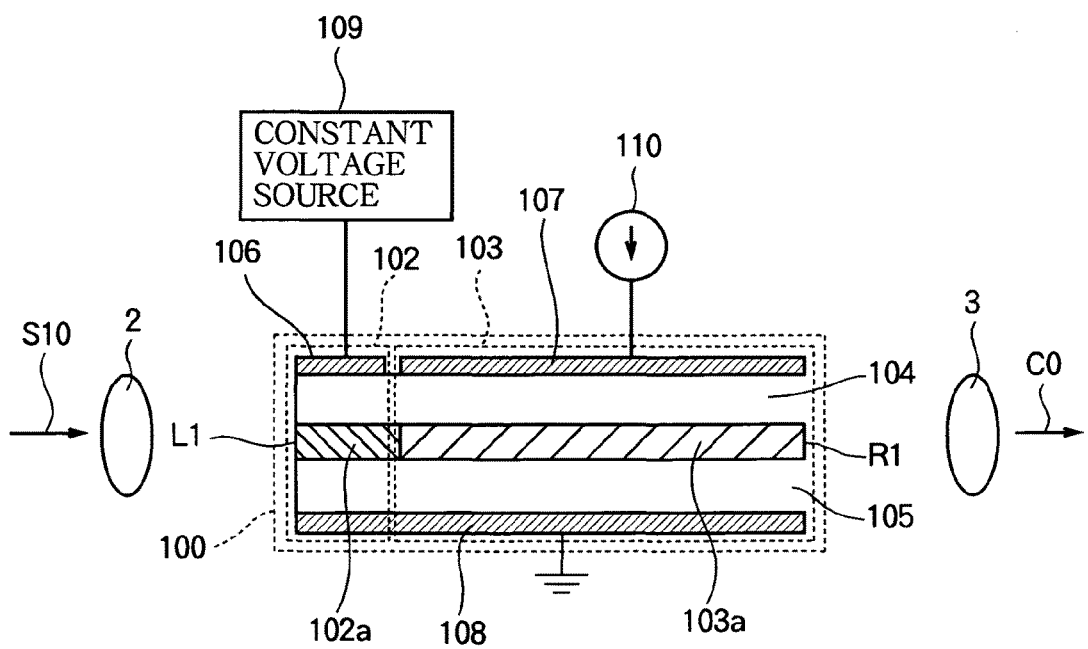
FIG. 2 is a longitudinal sectional view of the mode-locked laser diode in FIG. 1.

FIG. 2 depicts an integrated mode-locked semiconductor laser diode that can be advantageously used as the mode-locked laser diode 100. The optical signal S10 entering the left facet L1 through the coupling lens 2 propagates through the semiconductor active layer 102a of the saturable absorption region 102 and then the semiconductor active layer 103a of the gain region 103 and exits through the right facet R1 together with light generated by lasing to form optical signal C0. The semiconductor active layers 102a, 103a are bounded above by a p-side cladding layer 104 and below by an n-side cladding layer 105.

The saturable absorption region 102 is electrically coupled by a p-side electrode 106 and a common n-side electrode 108 to a constant voltage source 109 that applies a constant voltage. The gain region 103 is electrically coupled by a p-side electrode 107 and the common n-side electrode 108 to a constant current source 110 that puts out a constant direct current. When a direct-current voltage is applied across the saturable absorption region 102 and direct current is injected into the gain region 103, mode-locked lasing action occurs and the integrated mode-locked semiconductor laser generates and outputs an optical pulse train with a repetition rate approximately equal to an integer multiple of the round-trip frequency of the optical cavity of the device.

The mode-locked laser diode 100 is not limited to the structure shown in FIG. 2. Another type of integrated mode-locked semiconductor laser that can be used as the mode-locked laser diode 100 has a structure in which a passive waveguide region including a simple optical waveguide layer, not exhibiting any gain or saturable absorption effects, is integrated with a distributed Bragg reflecting region in which a distributed Bragg reflecting structure is formed.

The integrated mode-locked semiconductor laser may also have gain regions disposed at a plurality of locations, to control the characteristics of the generated pulse train, for example. There is no particular restriction on the positional relationships of the gain regions, the passive waveguide region, and the distributed Bragg reflecting region. For example, a saturable absorption region, a gain region, and a passive waveguide region may follow one another in this order in the direction of propagation of the optical pulses inside the mode-locked semiconductor laser, or the saturable absorption region may be followed by the passive waveguide region and then the gain region. It is necessary, however, for the saturable absorption region to be disposed at the L1 facet of the optical cavity. More precisely, since the L1 facet is generally a coated cleaved surface, the semiconductor active layer 102a of the saturable absorption region 102 should be directly adjacent to the cleaved surface of the L1 facet.

The semiconductor material from which the semiconductor active layers 102a, 103a are formed may be selected from, for example, the indium phosphide (InP) family or the gallium arsenide (GaAs) family, depending on the desired wavelength of the recovered optical clock signal, that is, the wavelength that appears during mode-locked operation of the mode-locked semiconductor laser. The mode-locked semiconductor laser in FIG. 2 may be formed on either an n-type substrate material (as shown) or a p-type substrate material.

In the following description, the term TE (transverse electric wave) polarized light will be used to refer to light polarized in a plane perpendicular to the drawing sheet in FIG. 2, that is, light having an electric vector that oscillates in a plane perpendicular to the drawing sheet. The term TM (transverse magnetic wave) polarized light will be used to refer to light polarized in a plane parallel to the drawing sheet in FIG. 2, that is, having an electric vector that oscillates in a plane parallel to the drawing sheet. The light generated by the mode-locked laser diode 100 will be assumed to be TE polarized. The first linearly polarized component of the optical signal is accordingly TM polarized, and the second linearly polarized component is TE polarized.

Figure 3:
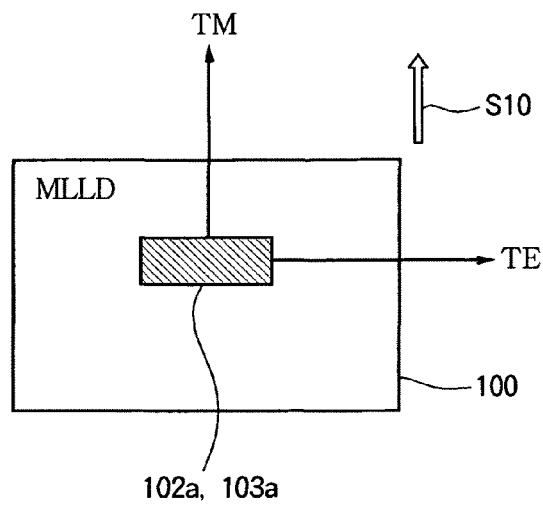
FIG. 3 is a simplified transverse sectional view of the mode-locked laser diode in FIG. 1.

In the sectional view in FIG. 3 taken in a plane perpendicular to the light propagation direction, looking toward facet L1, the TM polarization direction of the input optical signal is vertical, that is, the electric vector of the light waves oscillates vertically, and the TE polarization direction of the recovered optical clock signal is horizontal, that is, its electric vector of the light waves oscillates horizontally. This directional relationship holds in both the semiconductor active layer 102a of the saturable absorption region 102 and the semiconductor active layer 103a of the gain region 103, these semiconductor active layers 102a, 103a being mutually continuous.

In semiconductor lasers in general, the light generated by lasing action is polarized in a plane parallel to the p-n junction interfaces of the optical waveguide layer. In the following description, the mode-locked laser diode is also assumed to operate in this way, so the TE polarization direction is parallel to the waveguide layers or active layers 102a, 103a of the mode-locked laser diode and the TM polarization direction is the thickness direction of the waveguide layers (perpendicular to the p-n junctions).

Figure 4:
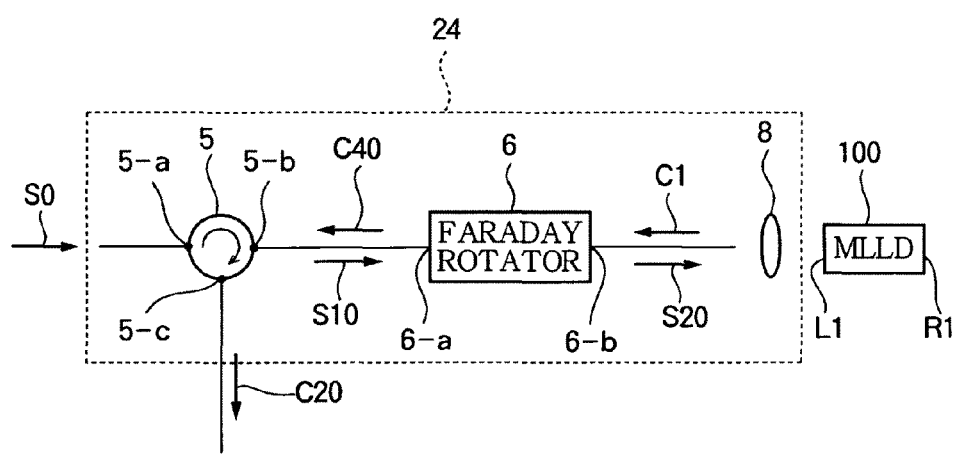
FIG. 4 is a block diagram schematically illustrating the structure of an optical clock signal recovery apparatus according to a second embodiment of the invention.
Figure 5:
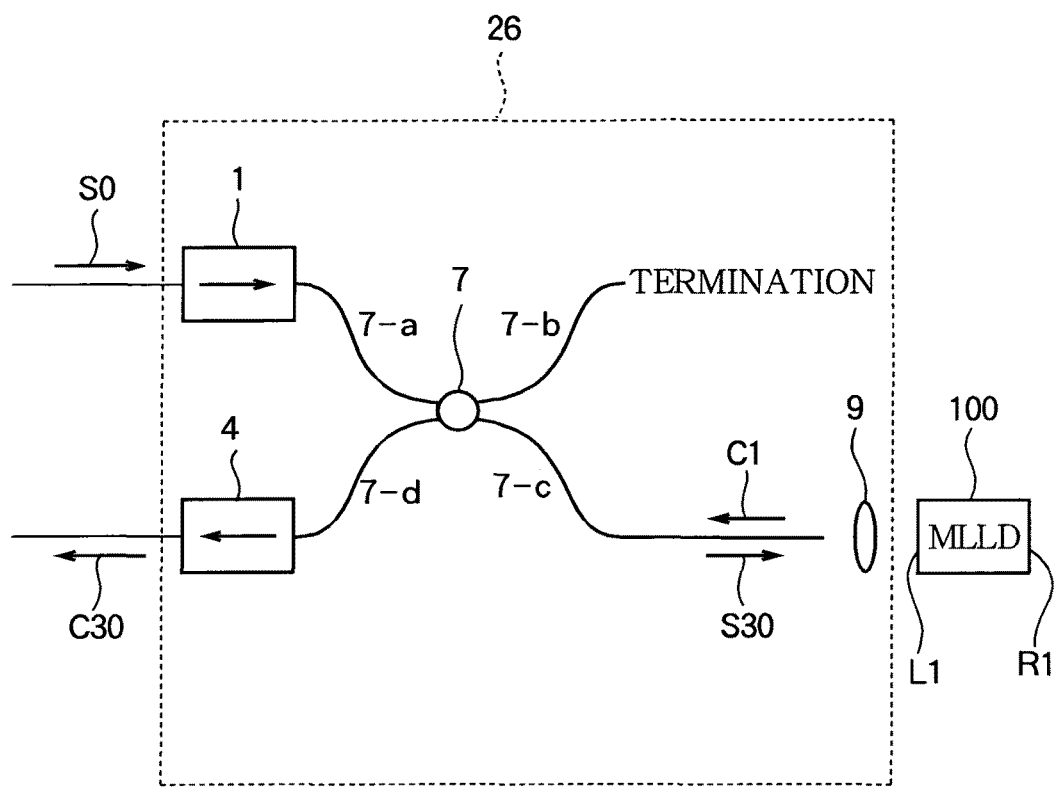
FIG. 5 is a block diagram schematically illustrating the structure of an optical clock signal recovery apparatus according to a third embodiment of the invention.

There are semiconductor lasers that output TM polarized laser light. The present invention can also be practiced with a semiconductor laser of this type if the polarization angles of the optical signals S10, S20, S30 input to the semiconductor lasers in FIGS. 1, 4, and 5 are rotated by 90 degrees so that they are parallel to the waveguide layer in the laser, and the orientation of the polarization-dependent optical components is changed accordingly.

The polarization-dependent optical isolators 1, 4 in FIG. 1 transmit light polarized in a particular direction and propagating in a particular direction, and block light propagating in the opposite direction. In the present embodiment, the first polarization-dependent optical isolator 1 operates as a polarizer, while the second polarization-dependent optical isolator 4 operates as an analyzer. One known method of constructing a polarization-dependent optical isolator employs a polarizing prism, a Faraday rotator, and a polarizing plate. Polarization-dependent optical isolators are also commercially available from, for example, Kogakugiken Co., Ltd. of Atsugi, Japan.

The first polarization-dependent optical isolator 1 is oriented with respect to the mode-locked laser diode 100 so as to transmit only light polarized in the TM direction of the mode-locked laser diode 100. The polarization direction of the input optical signal S0 is preferably controlled so as to minimize the loss in the first polarization-dependent optical isolator 1, so that optical signal S10 will have sufficient strength for successful clock recovery. For this purpose, a variable polarization controller (not shown) may be inserted in the optical path ahead of the first polarization-dependent optical isolator 1. Even without a polarization controller, however, the input optical signal S0 will generally include a component polarized in a direction that passes through the first polarization-dependent optical isolator 1, and this component will almost always produce a TM polarized optical signal S10 with the strength necessary for clock recovery when input to the mode-locked laser diode 100.

Polarization controllers that combine a quarter-wave plate with a half-wave plate are commercially available and can be used if necessary. One example is the PC-FFB Series manufactured by Indeco, Inc. of Tokyo, Japan.

The linearly polarized light that passes through the first polarization-dependent optical isolator 1 to become optical signal S10 maintains its state of polarization when focused by the coupling lens 2 onto the left facet L1 of the mode-locked laser diode 100. As seen from the mode-locked laser diode 100, optical signal S10 is a TM polarized signal as indicated in FIG. 3.

The mode-locked laser diode 100 outputs an optical pulse train signal C0 from its right facet R1 through coupling lens 3 to the second polarization-dependent optical isolator 4. The second polarization-dependent optical isolator 4 has its optical axis aligned with the propagation direction of the optical pulse train C0 and is oriented so as to transmit the TE polarized component of the light in the optical pulse train and block the TM polarized component. The TE polarized component accordingly becomes the recovered optical clock signal C10.

In conventional optical clock signal recovery apparatus employing a mode-locked laser diode, polarization-dependent optical isolators similar to the first and second polarization-dependent optical isolators of the present embodiment are used to prevent light output from the mode-locked laser diode from returning to the mode-locked laser diode and disrupting its mode-locked operation. The first and second polarization-dependent optical isolators 1, 4 also perform this function in the present embodiment, preventing unstable mode locking by blocking returning light.

In addition, in the present embodiment, the first and second polarization-dependent optical isolators 1, 4 have the key function of removing components of optical signals S0 and S10 so that the recovered optical clock signal C10 does not include any components of the input optical signal.

Second Embodiment

Referring to FIG. 4, in the second embodiment the input section and output section of the first embodiment are replaced by a single optical input-output section 24 disposed adjacent the left facet L1 of the mode-locked laser diode 100. The optical input-output section 24 comprises a polarization-dependent optical circulator 5, a Faraday rotator 6, and a coupling lens 8.

The polarization-dependent optical circulator 5 has an input port 5-$a$, an input-output port 5-$b$, and an output port 5-$c$. Light entering input port 5-$a$ and polarized in a particular plane is output from input-output port 5-$b$. Light entering input port 5-$a$ but polarized perpendicular to that plane is blocked. Similarly, light entering input-output port 5-$b$ and polarized in the same particular plane is output from output port 5-$c$, while light entering input-output port 5-$b$ but polarized perpendicular to that plane is blocked. A polarization-dependent optical circulator of this type can be constructed from polarization-dependent optical isolators of the type described above, as explained on pp. 327-329 of *Hikari tsushin gijutsu handobukku* (Handbook of optical communication technology), edited by Miki et al., published by Optronics Co., Ltd. of Tokyo, Japan.

The Faraday rotator 6 has a pair of input-output ports 6$a$ and 6$b$. Linearly polarized light entering one input-output port 6$a$ or 6$b$ is output from the other input-output port 6$b$ or 6$a$ with a 45° rotation of its plane of polarization.

The mode-locked laser diode 100 is similar to the mode-locked laser diode 100 in the first embodiment except that its right facet R1 is preferably coated so as to produce total reflection, so that all light generated by lasing in the mode-locked laser diode 100 is emitted through the left facet L1, which is adjacent to the saturable absorption region.

The input optical signal S0 enters the input port 5-$a$ of the polarization-dependent optical circulator 5. The component of the input optical signal S0 that is polarized in the particular plane is transmitted through the polarization-dependent optical circulator 5 and output from the input-output port 5-$b$ as optical signal S10 to input-output port 6$a$ of the Faraday rotator 6, where its plane of polarization is rotated by 45 degrees to produce an optical signal S20 that is output from input-output port 6$b$ through the coupling lens 8 to the left facet L1 of the mode-locked laser diode 100. The polarization-dependent optical circulator 5 and Faraday rotator 6 are oriented so that optical signal S20 is polarized in the TM direction of the mode-locked laser diode 100. As in the first embodiment, a polarization controller (not shown) is preferably placed ahead of the optical input-output section 24 to align the polarization of the input optical signal S0 so as to minimize loss in the polarization-dependent optical circulator 5, to ensure that optical signal S20 has sufficient strength for optical clock signal recovery.

The mode-locked laser diode 100 generates an optical pulse train C1 including a laser light component polarized in the TE direction, and an input light component inherited from optical signal S20, which is polarized in the TM direction. Optical pulse train C1 is emitted through the left facet L1 of the mode-locked laser diode 100 and returns through the coupling lens 8 to input-output port 6-*b* of the Faraday rotator 6. After a 45° rotation in the Faraday rotator 6, the laser light component of the optical pulse train C40 that leaves through input-output port 6-*a* is polarized the same plane as optical signal S10, and the input light component is polarized at an angle of 90° to this plane. Accordingly, the laser light component is transmitted from the input-output port 5-*b* of the polarization-dependent optical circulator 5 to the output port 5-*c*, from which it is output as the recovered optical clock signal C20, while the input light component of optical pulse train C40 is blocked.

Third Embodiment

Referring to FIG. 5, the third embodiment replaces the optical input-output section of the second embodiment with an optical input-output section 26 comprising a pair of polarization-dependent optical isolators 1, 4, a polarization-dependent optical coupler 7, and a coupling lens 9. The polarization-dependent optical isolators 1, 4 are similar to the polarization-dependent optical isolators in the first embodiment, the input optical signal S0 being input to the first polarization-dependent optical isolator 1 and the recovered optical clock signal C30 being output from the second polarization-dependent optical isolator 4.

The polarization-dependent optical coupler 7 has four ports 7-*a*, 7-*b*, 7-*c*, 7-*d*. Light input at port 7-*a* is coupled in equal or unequal portions to ports 7-*b* and 7-*c*. Light input at port 7-*c* is coupled in equal or unequal portions to ports 7-*a* and 7-*d*. The intensity ratio of the light output from port 7-*b* to the light output from port 7-*c* and the intensity ratio of the light output from port 7-*a* to the light output from port 7-*d* depend on the design of the polarization-dependent optical coupler 7 and are not limited to any particular values in the present embodiment.

Port 7-*a* is coupled to the first polarization-dependent optical isolator 1. Port 7-*b* is optically terminated so that no light emitted from port 7-*b* returns to port 7-*b*. Port 7-*c* is coupled through the coupling lens 9 to the mode-locked laser diode 100. Port 7-*d* is coupled to the second polarization-dependent optical isolator 4.

As in the preceding embodiments, a polarization controller (not shown) is preferably placed ahead of the first polarization-dependent optical isolator 1 in the optical input-output section 24 to align the polarization of the input optical signal S0 in a direction that minimizes loss in the first polarization-dependent optical isolator 1. If the polarization controller is capable of ensuring that all light input to the optical input-output section 26 is polarized in a particular direction, then the first polarization-dependent optical isolator 1 may be replaced by a polarization-independent optical isolator.

The component of the input optical signal S0 that is transmitted through the first polarization-dependent optical isolator 1 is coupled to port 7-*c* of the polarization-dependent optical coupler 7, becoming an optical signal S30 that enters the left facet L1 of the mode-locked laser diode 100, adjacent its saturable absorption region. The first polarization-dependent optical isolator 1 and polarization-dependent optical coupler 7 are oriented so that optical signal S30 is polarized in the TM direction of the mode-locked laser diode 100, perpendicular to the direction of polarization of the laser light produced in the mode-locked laser diode 100.

The optical pulse train C1 generated by the mode-locked laser diode 100 is coupled through the coupling lens 9 to port 7-*c* of the polarization-dependent optical coupler 7, and returns to both ports 7-*a* and 7-*d*. The part of optical pulse train C1 output from port 7-*a* is blocked in the first polarization-dependent optical isolator 1. The part of optical pulse train C1 output from port 7-*d* is transmitted through the second polarization-dependent optical isolator 4, but the second polarization-dependent optical isolator 4 is oriented so as to block the TM polarized component, leaving only the TE polarized component present in the recovered optical clock signal C30.

Operation of the First, Second and Third Embodiments

From the description above it can be seen that the optical input-output sections 24, 26 in the second and third embodiments perform essentially the same functions as the optical input section 20 and optical output section 22 in the first embodiment, so that all three embodiments operate in substantially the same way. A description of the operation of all three embodiments will now be given, comparing this operation with the operation of a conventional optical clock signal recovery apparatus. The conventional optical clock apparatus will be assumed to have optical signals analogous to those in the embodiments above.

Figure 7:
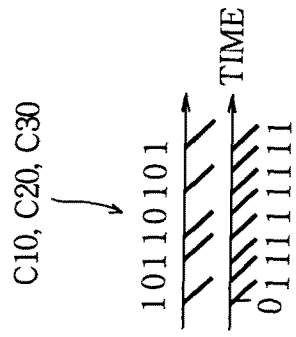
FIGS. 6 to 8 show exemplary pulse trains and polarization directions illustrating the operation of a conventional optical clock signal recovery apparatus.
Figure 6:
Figure 8:
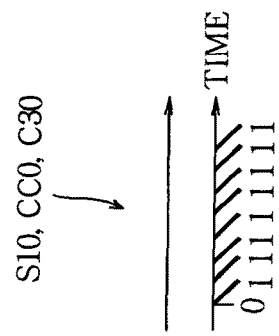
Figure 10:
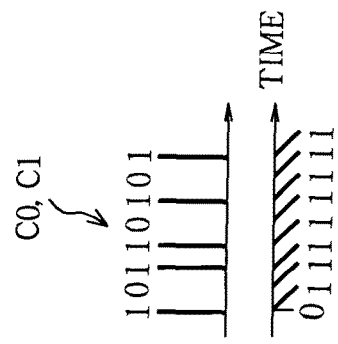
Figure 11:
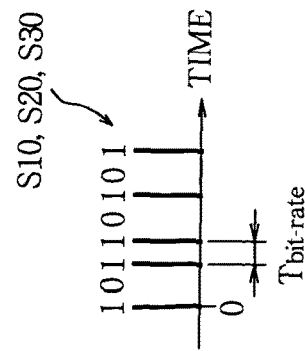

The operation of the conventional optical clock signal recovery apparatus is illustrated in FIGS. 6, 7, and 8. The operation of the present invention is illustrated in FIGS. 9, 10, and 11. In these drawings, optical pulses representing binary '1' data are represented by short lines extending from the time axis, and binary '0' data are represented by the absence of such lines. If the short lines extend sideways from the time axis (shown in perspective as extending diagonally down), the optical pulse train is polarized in the TE direction, matching the direction of polarization of the laser light generated by the mode-locked laser diode 100. If the short lines extend upward from the time axis, the optical pulse train is polarized in the perpendicular (TM) direction. FIGS. 6 and 9 show the input optical signal, FIGS. 7 and 10 show the optical pulse train output from the mode-locked laser diode, and FIGS. 8 and 11 show the recovered optical clock signal.

In the conventional apparatus, as shown in FIGS. 6 to 8, all optical signals S10, S20, S30, C0, C1, C10, C20, C30 are polarized in the TE direction, indicating that the conventional apparatus recovers an optical clock signal from an input optical signal polarized in substantially the same direction as the laser light produced by the mode-locked laser diode. The reasons for this are as follows.

In the conventional optical clock signal recovery apparatus disclosed by Smith, in which the input optical signal interacts with the optical clock pulses circulating in an optical-fiber mode-locked laser by cross phase modulation (XPM) due to the optical Kerr effect, for stable clock recovery the input optical signal and the optical clock signal must be polarized in parallel directions, because the optical Kerr effect is maximized in this state.

In the conventional optical clock signal recovery apparatus disclosed by Yano, Ono et al., Ludwig et al., Bao et al., and Arahira and Ogawa in the documents cited above, in which the optical clock pulses traveling back and forth in the optical cavity of the passive mode-locked semiconductor laser synchronize with the optical pulses constituting the input optical signal mainly because the optical absorption coefficient of the saturable absorber in the passive mode-locked semiconductor laser changes in synchronization with the optical pulses of the input optical signal, the saturable absorption region is electrically separated from the gain region. The saturable absorption region is simply a region that is excited at a different level from the gain region. In most reported devices, this region is reverse-biased.

The gain region of a semiconductor laser exhibits polarization-dependent operation because of the anisotropy of the optical waveguide structure of the gain region and the anisotropy of the quantum size effect exhibited when this optical waveguide has a quantum structure. In general, the bulk crystalline active layer or quantum-structured active layer used in the gain region amplifies TE polarized light with a high optical gain and generates TE polarized laser light. If a quantum-structured active layer is also used for the saturable absorber, it exhibits high absorption of TE polarized light, with a saturation absorption effect that occurs even at low energies.

Accordingly if the input optical signal that enters the bulk crystalline active layer or quantum-structured active layer used as the saturable absorber is TE polarized, the optical absorption coefficient is modulated sufficiently for optical clock recovery; conversely, if the input optical signal is TM polarized, the modulation of the optical absorption coefficient is inadequate for optical clock recovery. As a result, for successful optical clock signal recovery, it has been necessary for the input optical signal to be polarized in the same direction as the laser light generated in the semiconductor laser.

For these reasons, all of the optical clock signal recovery methods disclosed in the references cited above require the polarization direction of the input optical signal to match the polarization direction of the laser light that becomes the recovered optical clock signal. The optical pulse train C0 or C1 emitted from the mode-locked laser diode includes both the recovered clock component and an input signal component, which is polarized in the same direction. Even if this pulse train is passed through an optical analyzer element such as a polarization-dependent optical isolator, it is not possible to remove the input optical signal component which remains present in the signal C10, C20, or C30 in FIG. 8 finally output as the recovered optical clock signal.

If the input optical signal and the laser light generated by the mode-locked semiconductor laser have different wavelengths then it may be possible to filter the input optical signal component out of the recovered optical clock signal, but if their wavelengths are very close or equal, such filtering becomes impossible, so the recovered optical clock signal is necessarily distorted by a remaining component of the input optical signal.

In contrast, in the present invention, as shown in FIG. 9, the input optical signal is polarized in the TM direction. Although the optical signal C0 or C1 output from the mode-locked semiconductor laser in FIG. 10 includes an input optical signal component as well as the optical pulse train generated in the laser, the input optical signal component and the optical pulse train are polarized in mutually perpendicular directions. The polarization-dependent optical isolator 4 or polarization-dependent optical circulator 5 from which the recovered optical clock signal C10, C20, or C30 is output transmits the TE polarized optical pulse train but blocks the TM polarized input optical signal component, so the recovered optical clock signal does not include any input optical signal component, as shown in FIG. 11.

The present invention accordingly allows the recovery, even without a wavelength filter, of an optical clock signal that does not include any component of the input optical signal. In addition, since the input optical signal is polarized in a direction perpendicular to the direction of polarization of the laser light, injection locking does not occur in the mode-locked laser diode. As will be described in more detail later, the recovered optical clock signal is also free of effective modulation effects arising from optical resonance.

From the above explanation, it will be appreciated that the novel optical clock signal recovery apparatus does not require a wavelength filter, and that the optical clock recovery operation is stable in that the characteristics of the recovered optical clock signal do not change significantly if the wavelength of the input optical signal is changed.

For the first, second, and third embodiments to operate as described above, the semiconductor active layers 102a, 103a of the saturable absorption region 102 and gain region 103 in the mode-locked laser diode 100 should be structured as follows.

The semiconductor active layer 102a of the saturable absorption region 102 must exhibit an optical absorption coefficient modulation effect based on saturation absorption with respect to both the laser light generated by the mode-locked laser diode 100 and the input optical signal, which is polarized perpendicular to the laser light. The optical absorption coefficient modulation effect with respect to the laser light is a necessary condition for mode-locked operation. The optical absorption coefficient modulation effect with respect to the input optical signal is a necessary condition for optical clock signal recovery.

Either a bulk crystalline semiconductor active layer or a quantum-structured semiconductor active layer can exhibit an optical absorption coefficient modulation effect with respect to both the laser light generated by the mode-locked laser diode 100 and the input optical signal. It is known that a bulk crystalline semiconductor active layer made of a III-V semiconductor material such as InP, GaAs, or a combination thereof possesses equal optical gain and equal optical absorption with respect to both TE and TM polarized light. It is also known that by introducing tensile strain into a quantum structure, it is possible to narrow the bandgap between the electron and light hole bands and thereby adjust the optical gain and optical absorption characteristics with respect to TM polarized light so that they are substantially equal to the optical gain and optical absorption characteristics with respect to TE polarized light.

The semiconductor active layer 103a of the gain region 103 must be structured so that its lasing characteristics, in particular the polarization of the laser light, are not changed by external input of an optical signal, because when optical signals S10, S20, S30 are input to the mode-locked laser diode 100 in the above embodiments, the mode-locked laser diode 100 must continue to emit laser light polarized in a plane perpendicular to the plane of polarization of the input optical signal. A mode-locked laser diode that matches the plane of polarization of its laser emission to the plane of polarization of the input optical signal cannot be used in the present invention.

A mode-locked laser diode that has this property of not changing the polarization of its laser light in response to an input optical signal must have a semiconductor active layer 103a in which gain shows a strong polarization dependency, and the lasing threshold gain must be much lower for TE polarization than for TM polarization. This requirement can be met by a semiconductor active layer 103a with an unstrained or compressively strained quantum structure. If the semiconductor active layer 103a has a bulk crystalline structure or a tensile strained quantum structure, the polarization dependency of its optical gain becomes small, and the polarization of the laser light is liable to change when an input optical signal is present.

If the semiconductor active layer 103a has an unstrained or compressively strained quantum structure, then while it shows optical gain for TE polarized light, it absorbs TM polarized light. Accordingly, even if TM polarized light enters the mode-locked laser diode, the TM polarized light is attenuated by each round trip made in the optical resonant cavity, and does not lase in the mode-locked laser diode. In the present embodiments, the input optical signal does not lase in the mode-locked laser diode. Consequently, there is no effective modulation effect due to optical resonance effects in the mode-locked laser diode, and multiple modulation effects do not occur. Therefore, even if the wavelength of the input optical signal changes a little, the characteristics of the recovered optical clock signal will not change significantly. That is, there is little dependency between the wavelengths of the input optical signal and the recovered optical clock signal. This lack of dependency makes the optical clock signal recovery apparatus easier to use.

The input optical signal must be input to the facet of the mode-locked laser diode at which the saturable absorption region is disposed, which is the left facet L1 in the drawings. If the input optical signal were to enter at the right facet R1, the TM polarized input optical signal light would be strongly attenuated in the gain region 103 before reaching the saturable absorption region, and optical clock signal recovery would not be possible unless the input optical signal had a high signal strength.

Results of experiments carried out to verify the effect of the present invention will now be described. The mode-locked laser diodes used in these experiments were multi-electrode semiconductor lasers made of an InP material and had a saturable absorption region seventy micrometers (70 µm) long, a gain region 605 µm long, a phase adjustment region 145 µm long, and a distributed Bragg reflecting (DBR) region 120 µm long, disposed following one another in this order. An InGaAsP bulk crystalline material having a bandgap wavelength equivalent to 1.3 µm was used in the phase adjustment region and the DBR region. The facet adjacent the saturable absorption region was an uncoated cleaved surface; the facet adjacent the DBR region was coated with a non-reflecting thin film of $Al_2O_3$.

FIG. 2 showed only the parts of the mode-locked laser diode necessary for operation of the present invention, omitting the phase adjustment region and DBR region. Although these two regions make the laser diode easier to use, since they are not necessary for the operation of the present invention, detailed descriptions of them will be omitted.

The length of the optical cavity was 1155 µm, and its optical round-trip frequency was approximately 39.8 GHz. In the gain region, the InGaAsP semiconductor active layer had a six-layer multiple quantum well structure with 0.7% compressive strain. The crystal ratios and thicknesses of the quantum well layers and barrier layers were selected to give this multiple quantum well structure a photoluminescence peak wavelength of 1565 nm.

In the saturable absorption region, the InGaAsP semiconductor active layer had a six-layer multiple quantum well structure with 0.7% tensile strain. In this multiple quantum well structure, the quantum well layers and barrier layers were selected so that the photoluminescence peak wavelength of emission due to transitions between the electron band and the heavy hole band, which contribute mainly to the emission of TE polarized light, was 1485 µm, and the photoluminescence peak wavelength of emission due to transitions between the electron band and the light hole band, which contribute mainly to the emission of TM polarized light, was 1560 µm.

The mode-locked laser diodes used in these experiments generated TE polarized light and operated with typical semiconductor characteristics. When current was injected into the gain region, the lasing threshold was approximately fifteen milliamperes (15 mA), and the slope efficiency was 0.13 watts per ampere (0.13 W/A).

Mode-locked operation was observed when 140 mA of direct current was injected into the gain region and the saturable absorption region was reverse-biased at −1.60 V. The width of the optical pulses in the mode-locked pulse train output from the laser was 3.26 picoseconds (3.26 ps), the center wavelength was 1552 nm (more precisely, 1551.85 nm), and the half-power width of the wavelength spectrum was 0.77 nm. The repetition frequency of the mode-locked pulse train output from the laser was 39.663 GHz. The average optical intensity of the optical pulse train component output from the facet adjacent the saturable absorption region (facet L1 in the drawings) and coupled into the optical fiber was approximately 1.60 decibels referenced to one milliwatt (1.60 dBm). The loss at the optical coupling into the fiber was estimated at five decibels (5 dB).

A pseudo-random optical signal of order 31 (repeating after 231-1 bits) with a bit rate of 39.653 Gb/s, an optical pulse width of 4 ps to 6 ps, and a return-to-zero (RZ) format was used as the input optical signal. The input optical signal was generated by use of a variable-wavelength semiconductor laser and two electro-absorption (EA) modulators. One EA modulator modulated the laser output to generate an optical pulse train; the other EA modulator modulated the optical pulse train to generate the pseudo-random optical signal. In the experiments, the wavelength of the variable-wavelength semiconductor laser was varied to evaluate the effects on the characteristics of the recovered optical clock signal.

The experiments were carried out with an optical clock signal recovery apparatus of the type shown in the second embodiment in FIG. 4. The input optical signal was fed through a polarization-dependent optical circulator 5 and a Faraday rotator 6 into the facet L1 of the mode-locked laser diode 100 adjacent the saturable absorption region. The optical pulse train C1 output from the same facet L1 was returned through the Faraday rotator 6 to the polarization-dependent optical circulator 5 and output as the recovered optical clock signal C20.

For comparison, the Faraday rotator 6 was removed, an input optical signal polarized in the same direction as the laser light generated by the mode-locked laser diode was input to the L1 facet as in conventional optical clock signal recovery apparatus, and the recovered optical clock signal was evaluated.

FIGS. 12 to 19 show the results of experiments in which the wavelength $\lambda_{in}$ of the input optical signal was 1540 nm (FIGS. 12, 14, 16, 18) and 1550 nm (FIGS. 13, 15, 17, 19). Results obtained with the conventional apparatus are shown in FIGS. 12, 13, 16, and 17. Results obtained with the novel apparatus are shown in FIGS. 14, 15, 18, and 19. FIGS. 12 to 15 indicate the spectrum of the recovered optical clock signal, with wavelength shown on the horizontal axis in nanometers and output power shown on the vertical axis in dBm. FIGS. 16 to 19 indicate the second harmonic generation (SHG) correlation waveform of the recovered clock signal, with delay shown on the horizontal axis in picoseconds and SHG intensity in arbitrary units shown on the vertical axis. The dark solid curves indicate data obtained with the input optical signal S0 present; the light dotted curves indicate data obtained with the input optical signal S0 absent.

Figure 12:
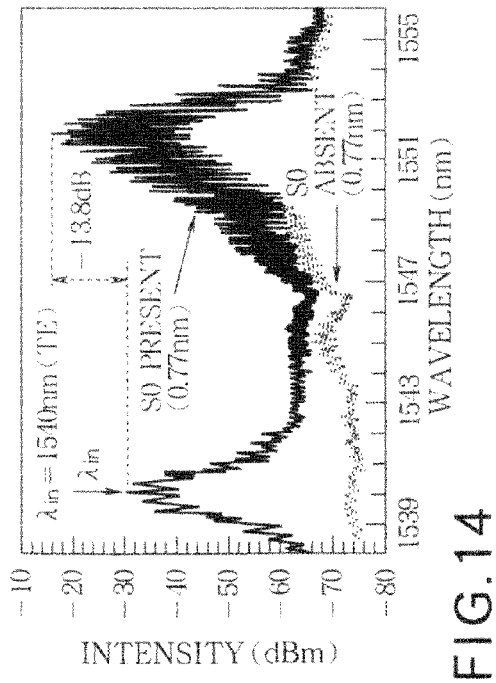
Figure 14:
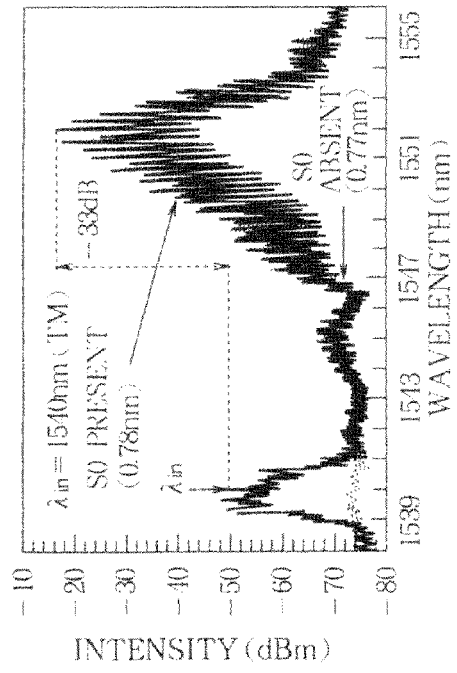

As shown in FIGS. 12 and 14, when the input wavelength was 1540 nm, there was no major change in the shape of the principal component of the spectrum centered around the lasing wavelength of 1552 nm, regardless of the presence or absence of the input optical signal and regardless of its polarization direction. These results were obtained because, in the vicinity of 1540 nm, the gain region of the mode-locked laser diode had a low optical gain and the saturable absorption region had a high absorption, suppressing optical resonance effects, and the tensile strain introduced into the quantum well structure of the saturable absorption region suppressed the polarization dependency of the optical modulation effect due to the input optical signal in the saturable absorption region.

Figure 16:
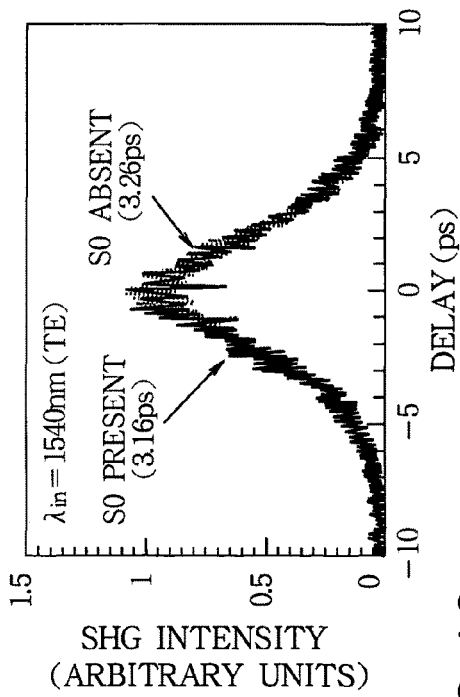
Figure 18:
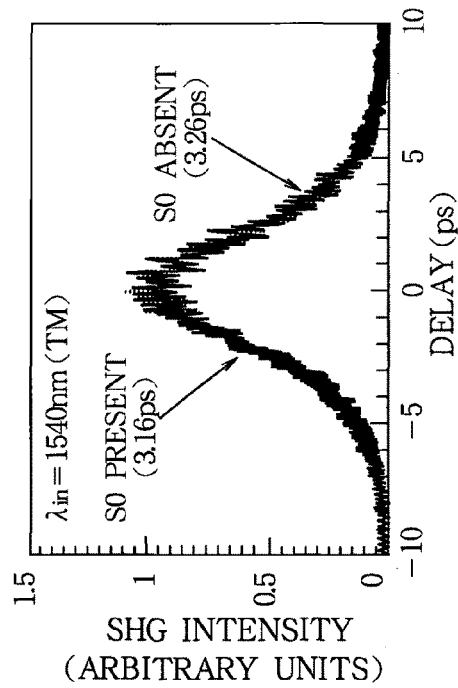

Similarly, as shown in FIGS. 16 and 18, when the input wavelength was 1540 nm, no major change was observed in the shape of the SHG correlation waveform. In both the conventional and novel apparatus, SHG intensity curves indicated that the pulse width of the recovered optical clock signal was 3.16 ps when the input optical signal was present and 3.26 ps when the input optical signal was absent.

Referring again to FIGS. 12 and 14, although the presence or absence of the input optical signal made no discernable difference in the shape of the major peak at the lasing wavelength, it made a clear difference in the spectrum at the 1540-nm wavelength of the input optical signal. When the input optical signal was present, a peak appeared at this wavelength in the recovered optical clock signal. With the conventional apparatus (FIG. 12), the height of this peak was 13.8 dB lower than the height of the main peak at 1552 nm. With the novel apparatus (FIG. 16), the height of this peak was 33 dB lower than the height of the main peak at 1552 nm. If the input signal suppression ratio is defined as the ratio of the power of the recovered optical clock signal at the input optical signal wavelength to the power of the recovered optical clock signal at the lasing wavelength, then the novel apparatus had an input signal suppression ratio of −33 dB. In comparison, the conventional apparatus had an input signal suppression ratio of only −13.8 dB. This difference of nearly twenty decibels matched the polarization extinction ratio of the apparatus that generated the input optical signal in these experiments.

With improved assembly techniques it would be possible to raise the polarization extinction ratio to more than twenty decibels. Accordingly an input signal suppression ratio of more than −33 dB is possible when the input optical signal is TM polarized.

Figure 13:
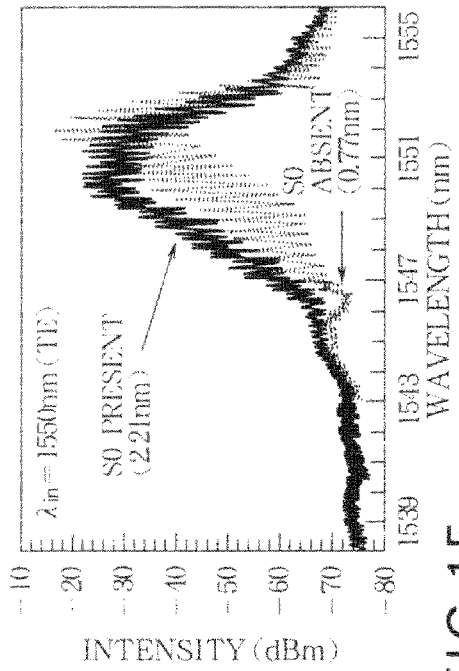
FIGS. 12 and 13 illustrate wavelength spectra of the optical clock signal recovered by the conventional optical clock signal recovery apparatus.

As shown in FIG. 13, when the input optical signal was TE polarized and had a wavelength was 1550 nm, the presence or absence of the input optical signal made a major difference in the shape of the principal peak of the spectrum of the recovered optical clock signal. The width of this peak, which was 0.77 nm when the input optical signal was absent, broadened to 2.21 nm when the input optical signal was present. Moreover, the input signal suppression ratio was +4 dB; the input optical signal component was stronger than the recovered optical clock signal component. The reason for this is that since the input optical signal was TE polarized and its wavelength was close to the lasing wavelength, multiple modulation effects occurred due to optical resonance, or optical injection effects occurred. Although the suppression ratio of +4 dB is hard to read from FIG. 13, it was confirmed on the display of the measuring instrument used in the experiment.

Figure 15:
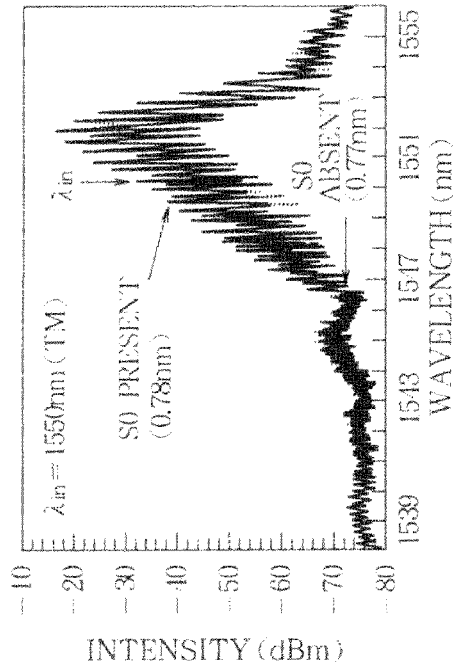
FIGS. 14 and 15 illustrate wavelength spectra of the optical clock signal recovered by the optical clock signal recovery apparatus in the first, second, and third embodiments.

When the polarization of the input optical signal was changed to TM as in FIG. 15, the width of the peak of the recovered optical clock signal spectrum at 1552 nm was reduced to 0.78 nm, and the input optical signal suppression ratio became −26 dB. This value is also hard to read from the drawing but was confirmed by the measuring instrument.

Figure 17:
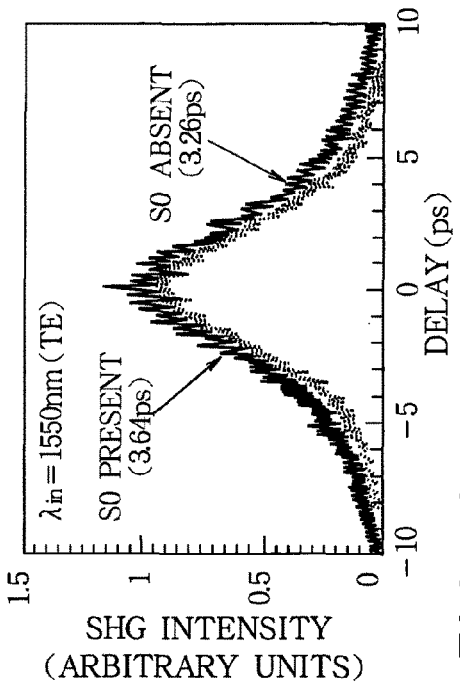
FIGS. 16 and 17 illustrate second harmonic generation correlation waveforms of the optical clock signal recovered by the conventional optical clock signal recovery apparatus.
Figure 19:
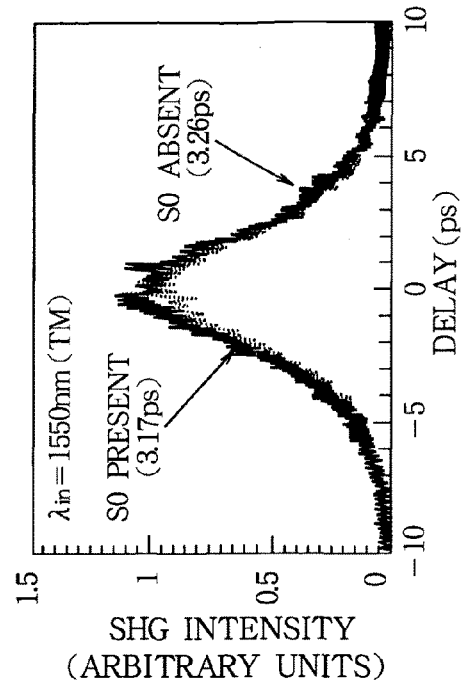
FIGS. 18 and 19 illustrate second harmonic generation correlation waveforms of the optical clock signal recovered by the optical clock signal recovery apparatus in the first, second, and third embodiments.

Referring to FIGS. 17 and 19, when the 1550-nm input optical signal was absent, the pulse width of the recovered optical clock signal was 3.26 ps in both the novel and conventional apparatus. When the input optical signal was present, this value changed to 3.17 ps in the novel apparatus but to 3.64 in the conventional apparatus. The SHG waveforms when the input optical signal was present and absent were practically indistinguishable in the novel apparatus (FIG. 19) but there was a clear difference between them in the conventional apparatus (FIG. 17).

In the experiment illustrated in FIGS. 20 to 23, the wavelength of the input optical signal was varied from 1530 nm to 1560 nm and the temporal jitter (FIG. 20), optical pulse width (FIG. 21), wavelength spectral width (FIG. 22), and input optical signal (S0) suppression ratio (FIG. 23) of the recovered optical clock signal were measured. In each drawing, the wavelength of the input optical signal (S0) is indicated in nanometers on the horizontal axis, and the measured value is indicated on the vertical axis. The white dots represent data measured with TE polarized optical signal input. The black dots represent data measured with TM polarized optical signal input.

Figure 21:
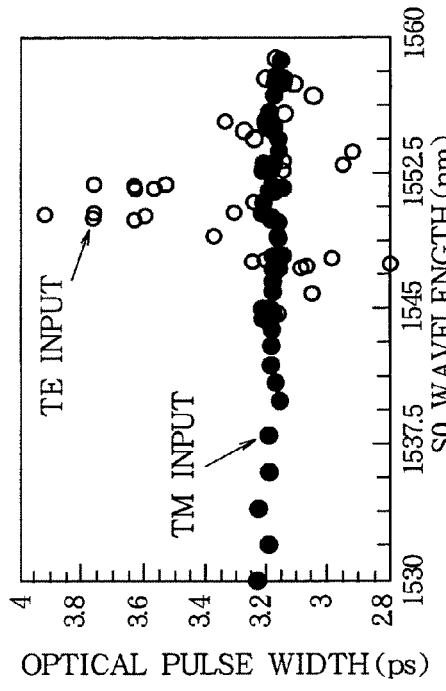
FIGS. 20, 21, 22, and 23 illustrate characteristics of the optical clock signals recovered by the conventional optical clock signal recovery apparatus and the optical clock signal recovery apparatus in the first, second, and third embodiments.
Figure 20:
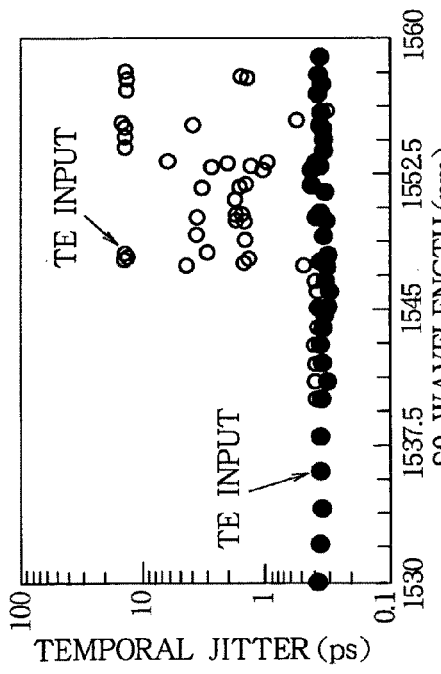
Figure 22:
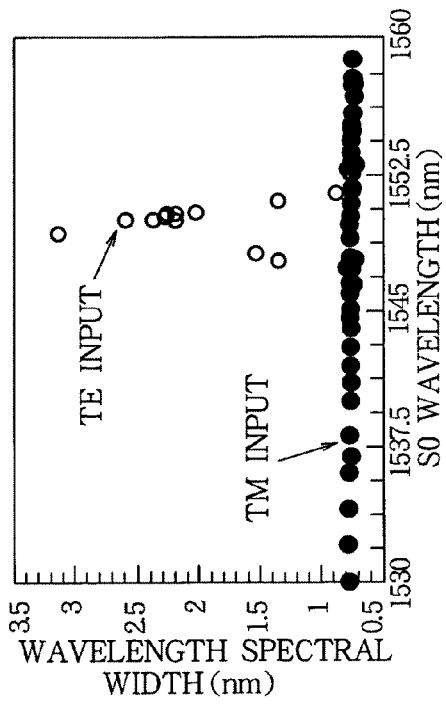

FIGS. 20 to 22 indicate that with TM polarized optical signal input as in the novel apparatus, the temporal jitter, optical pulse width, and wavelength spectral width of the recovered optical clock signal remained substantially constant as the input optical signal wavelength was varied from 1530 nm to 1560 nm. With TE polarized optical signal input as in the conventional apparatus, however, all of these parameters showed marked variability when the input optical signal wavelength was close to the lasing wavelength of 1552 nm. The variability indicates the presence of optical injection effects or of multiple modulation effects due to optical resonance.

Figure 23:
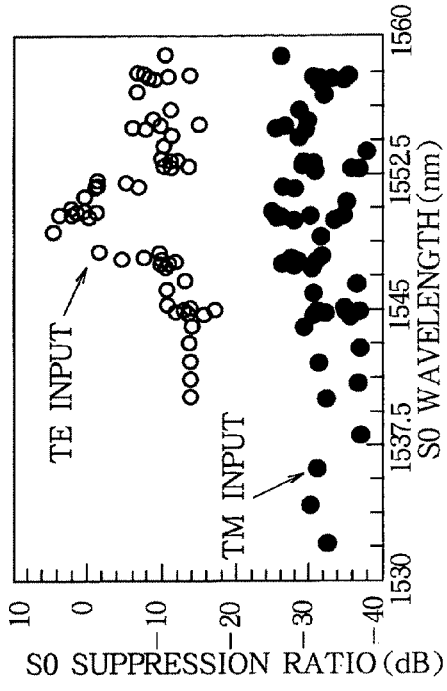

As shown in FIG. 23, the input optical signal suppression ratio varied with the input optical signal wavelength in both the conventional and the novel apparatus, but suppression was consistently better in the novel apparatus with TM polarized optical signal input than in the conventional apparatus with TE polarized optical input. With TM polarized optical signal input even the worst suppression values were better than (below) −25 dB, while with TE polarized optical signal input, in the vicinity of the lasing wavelength the suppression values were worse than (exceeded) 0 dB. Moreover, with TM polarized optical signal input the suppression values can be improved by better assembly techniques, which would not lead to improved suppression of a TE polarized optical input signal.

Figure 25:
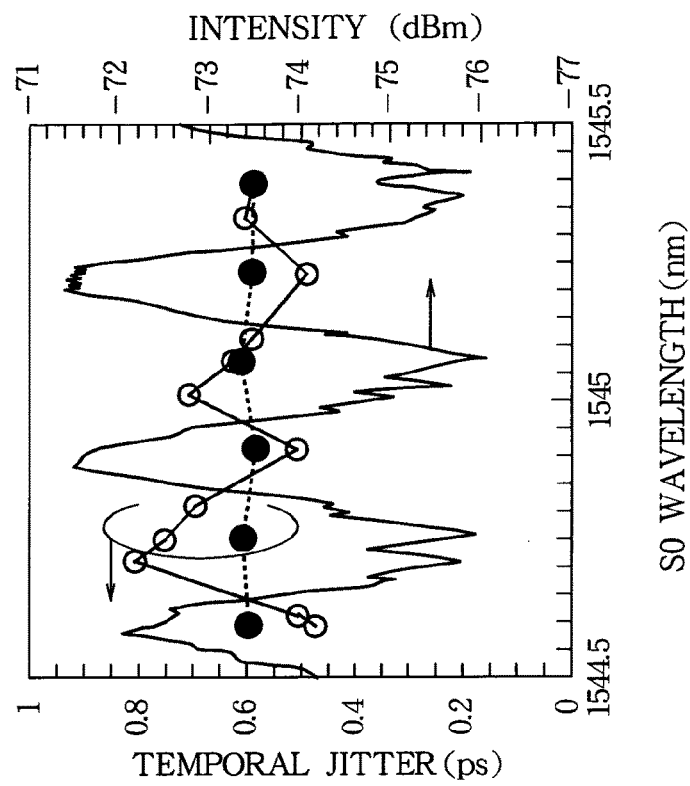
FIGS. 24 and 25 illustrate the temporal jitter and intensity characteristics of the conventional optical clock signal recovery apparatus and the optical clock signal recovery apparatus in the first, second, and third embodiments in two wavelength regions.
Figure 24:
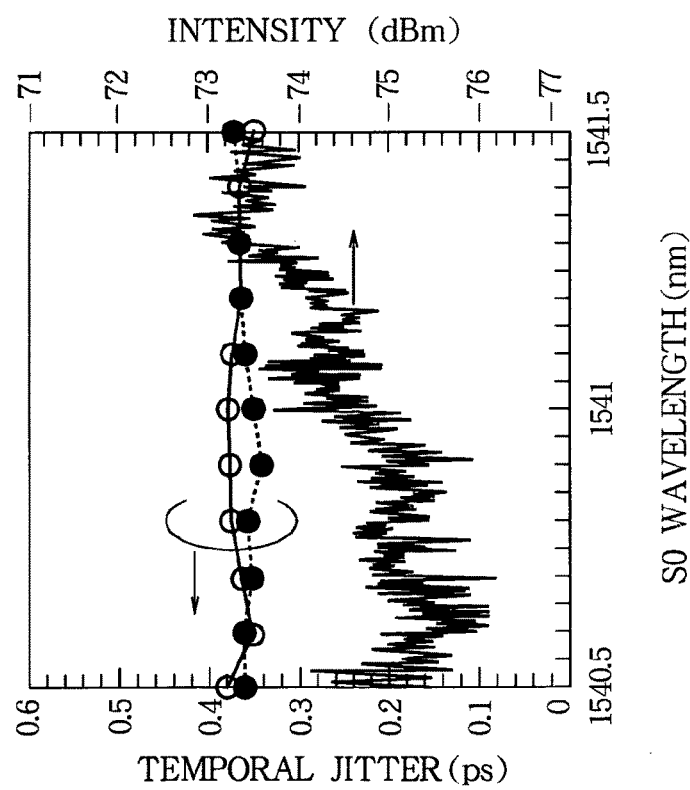

FIGS. 24 and 25 shows the results of experiments to test the dependency of temporal jitter and output intensity on the input optical signal wavelength more precisely. The input optical signal wavelength is again indicated on the horizontal axis. On the vertical axes, temporal jitter is indicated in picoseconds and the intensity or power of the recovered optical clock signal is indicated in dBm. FIG. 24 shows variations in these values as the input optical signal wavelength varies over a 1-nm range centered on 1541 nm. FIG. 25 shows variations in the same values as the input optical signal wavelength varies over a 1-nm range centered on 1545 nm. In both drawings, the data points indicated by white circles joined by a solid line are optical jitter values when the input optical signal was TE polarized, and the data points indicated by black circles joined by a dotted line are optical jitter values when the input optical signal was TM polarized. The remaining curve in each diagram indicates the intensity of the recovered optical clock signal at the lasing wavelength.

In this experiment, to investigate optical resonance effects in more detail, the strength of the input optical signal was set at −4.5 dBm, low enough that optical injection locking would not occur. The size of the optical resonance effect in a mode-locked laser diode is indicated by the size of the ripple of the lasing wavelength power curve, the ripple being defined as the ratio of the maximum value to the minimum value.

As shown in FIG. 24, when the input wavelength was varied around 1541 nm, optical jitter remained nearly constant, and was substantially the same regardless of the polarization direction of the input optical signal. This reflects the low dependency of the optical absorption coefficient modulation of the saturable absorption region on the polarization of the input light, due to the tensile strained quantum well structure of the saturable absorption region. The ripple of the lasing wavelength power curve is also comparatively small.

In FIG. 25 temporal jitter depends strongly on the wavelength of a TE polarized input optical signal but continues to be nearly independent of the wavelength of a TM polarized input optical signal. The maxima and minima of the temporal jitter curve for a TE polarized input optical signal match the minima and maxima of the lasing wavelength intensity curve. This indicates the occurrence of multiple modulation effects due to optical resonance when the input optical signal is TE polarized, these effects being the principal cause of the wavelength dependency of temporal jitter. When the input optical signal is TM polarized, multiple modulation effects do not occur, which is why the temporal jitter value remains substantially constant as the wavelength of the input optical signal changes.

The experiments that gave the results in FIGS. 20 to 25 confirmed that the optical clock signal recovery apparatus in the embodiments above is capable of recovering an optical clock signal without the occurrence of multiple modulation effects and optical injection effects, and showed that when multiple modulation effects and optical injection effects were absent, temporal jitter, optical pulse width, and the wavelength spectral width were held nearly constant, not depending on the wavelength of the input optical signal.

An optical clock signal can be recovered from an input optical signal if its wavelength is within the range in which optical absorption modulation due to saturation takes place in the saturable absorption region. Consideration of the gain and optical absorption bands of semiconductor lasers in general leads to the conclusion that the optical clock signal recovery apparatus in the above embodiments can recover an optical clock signal from input optical signals having wavelengths that range over at least several tens of nanometers.

FIGS. 26 to 31 show examples of the time-domain waveforms of recovered optical clock signals observed with an optical sampling oscilloscope. The input optical signal in FIG. 26 was TE polarized with a wavelength of 1556 nm and the recovered optical clock signal was observed as output directly from the polarization-dependent optical circulator, without using a wavelength filter. The input optical signal in FIG. 27 was TE polarized with a wavelength of 1556 nm and the recovered optical clock signal output from the polarization-dependent optical circulator was observed through a wavelength filter with a half-power width of 2.8 nm. The input optical signal in FIG. 28 was TM polarized with a wavelength of 1556 nm and the recovered optical clock signal was observed as output directly from the polarization-dependent optical circulator, without using a wavelength filter. The input optical signal in FIG. 29 was TE polarized with a wavelength of 1553.2 nm and the recovered optical clock signal was observed through a wavelength filter with a half-power width of 2.8 nm. The input optical signal in FIG. 30 was TE polarized with a wavelength of 1553.2 nm and the recovered optical clock signal output from the polarization-dependent optical circulator was observed through a wavelength filter with a half-power width of 2.8 nm. The input optical signal in FIG. 31 was TM polarized with a wavelength of 1553.2 nm and the recovered optical clock signal was observed as output directly from the polarization-dependent optical circulator, without using a wavelength filter.

Figure 26:
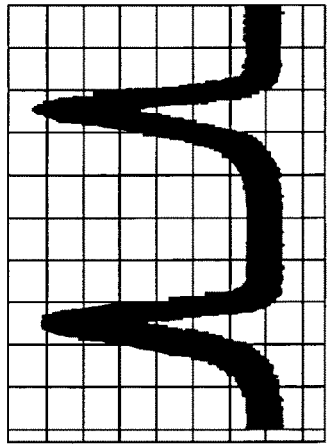
FIGS. 26 to 31 illustrate waveforms of optical clock signals recovered by the conventional optical clock signal recovery apparatus with and without an optical wavelength filter, and by the optical clock signal recovery apparatus in the first, second, and third embodiments, for two input wavelengths.
Figure 27:
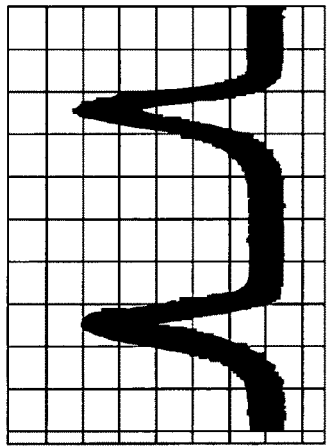
Figure 28:
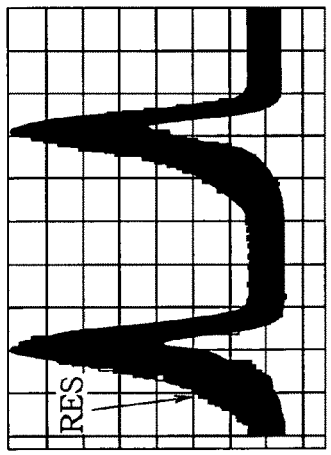
Figure 29:
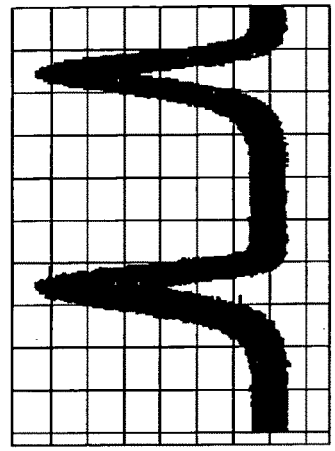
Figure 30:
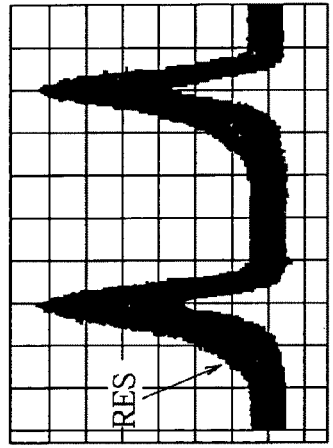
Figure 31:

In FIGS. 26 to 28, the 1556-nm wavelength of the input optical signal is comparatively distant from the 1552-nm lasing wavelength of the mode-locked laser diode. In FIGS. 29 to 31, the 1553.2-nm wavelength of the input optical signal is comparatively close to the 1552-nm lasing wavelength of the mode-locked laser diode.

In FIGS. 26 and 29, the rising edge of the waveform of the recovered optical clock signal is distorted by a residual component (RES) of the TE polarized input optical signal. When the input optical signal wavelength is comparatively far from the wavelength of the recovered optical clock signal, the distortion can be removed by an optical wavelength filter as shown in FIG. 27. These figures also demonstrate the need for a wavelength filter in the conventional clock recovery methods using a TE polarized input optical signal.

When the input optical signal wavelength is close to the wavelength of the recovered optical clock signal, however, although the distortion of the rising edge of the recovered optical clock signal is reduced by the optical wavelength filter, some distortion is still observed, as shown in FIG. 30.

In the above embodiments of the present invention, in which the input optical signal is TM polarized, no residual components of the input optical signal are observed in the recovered optical clock signal waveform, regardless of whether the input optical signal wavelength is separated from the recovered optical clock signal wavelength as in FIG. 28 or close to the recovered optical clock signal wavelength as in FIG. 31.

From FIGS. 26 to 31, accordingly, it can be seen that the above embodiments recover an optical clock signal uncontaminated by residual components of the input optical signal, without using an optical wavelength filter, regardless of whether or not the input optical signal wavelength is close to the lasing wavelength of the mode-locked laser diode.

Fourth Embodiment

Single-mode optical fiber is normally used for long-haul transport of optical signals. Single-mode optical fiber is polarization-independent; the optical signal propagates through the fiber without changing its polarization state. Even if the polarization state is precisely aligned at the input end of the fiber, however, the polarization state at the output end may differ because of the way in which the fiber is installed, or because of environmental conditions on the fiber path that cause unintended rotation of the plane of polarization.

When an optical clock signal recovery apparatus is used in a long-haul optical communication system, accordingly, the polarization state of the optical signal input to the apparatus tends to be indeterminate. In the first, second, and third embodiments described above, the optical signals S10, S20, S30 input to the mode-locked laser diode have a particular polarization state, perpendicular to the polarization of the laser light produced by the mode-locked laser diode. As noted in the preceding embodiments, to ensure that sufficient signal energy passes through the input polarization-dependent optical isolator or polarization-dependent optical circulator to produce an optical signal S10, S20, or S30 from which an optical clock signal can be recovered, a variable polarization controller may need to be added ahead of the input section or input-output section of the optical clock signal recovery apparatus. A variable polarization controller, however, is large and expensive to manufacture, and controlling it requires electrical power.

In the fourth embodiment, the first embodiment is modified by adding a birefringent medium to the input section to ensure that enough optical energy for optical clock signal recovery will pass through the input polarization-dependent optical isolator regardless of the polarization state of the input optical signal.

Figure 32:
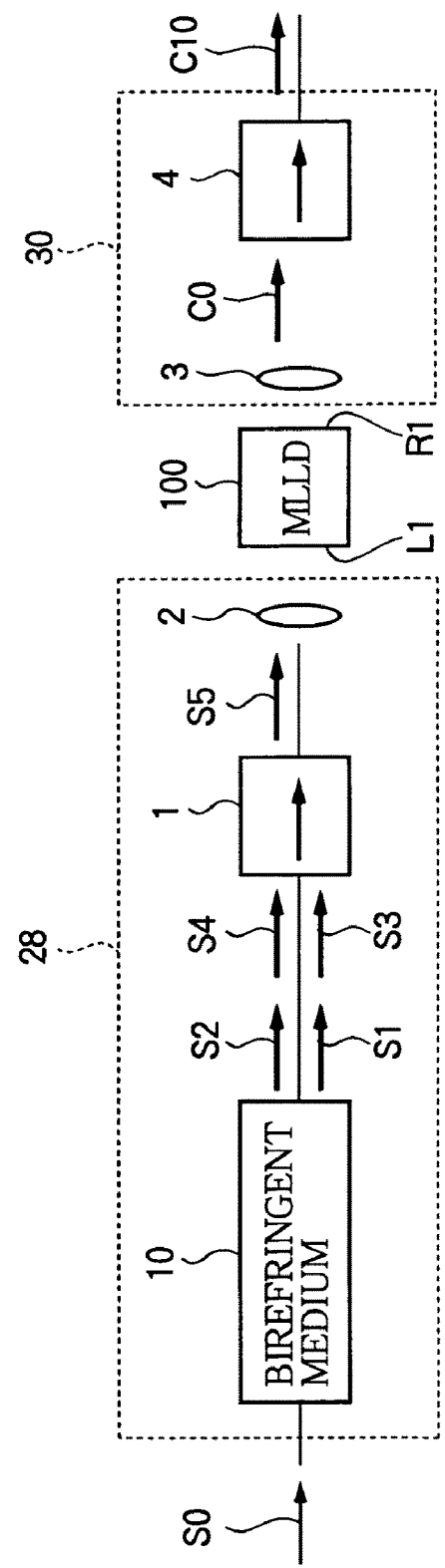
FIG. 32 is a block diagram schematically illustrating the structure of an optical clock signal recovery apparatus according to a fourth embodiment of the invention.

Referring to FIG. 32, the fourth embodiment includes an input section 28, an output section 30, and the same mode-locked laser diode 100 as in the preceding embodiments. The output section 30 comprises the same coupling lens 3 and second polarization-dependent optical isolator 4 as in the first embodiment. The input section 28 comprises the same first polarization-dependent optical isolator 1 and coupling lens 2 as in the first embodiment, and an additional birefringent medium 10 that receives the input optical signal S0 adjusts its polarization.

The birefringent medium 10 may be an optical crystal comprising either a uniaxial or a biaxial crystal material. Alternatively, the birefringent medium 10 may be a birefringent optical fiber or some other type of device comprising an amorphous material, provided the conditions given below are satisfied.

The length of the birefringent medium 10 is selected so that the differential group delay of the input optical signal in the birefringent medium is an integer multiple of the bit period ($T_{bit-rate}$) of the input optical. That is, the difference in propagation time through the birefringent medium of the two perpendicularly polarized components of the input optical signal produced by the birefringence of the medium (the difference in refractive index between its two optical axes) is $n \times T_{bit-rate}$, where n is an integer greater than zero.

Figure 33:
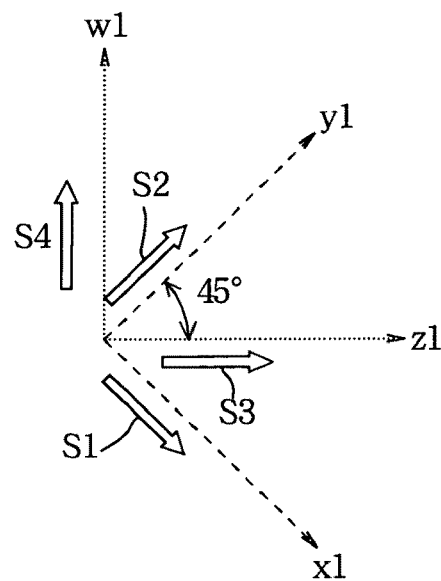
FIG. 33 illustrates the polarization directions of optical signals S1 to S4 in relation to optical axes of the polarization-dependent optical isolator and birefringent medium in FIG. 32.

The relative orientations of the birefringent medium 10 and the first polarization-dependent optical isolator 1 are explained in FIG. 33. Reference characters w1 denote the direction of polarization of light transmitted through the first polarization-dependent optical isolator 1. Reference characters z1 denote the direction of polarization of light blocked by the first polarization-dependent optical isolator 1. Reference characters x1 and y1 denote the two mutually perpendicular optical axes of the birefringent medium 10. The birefringent medium 10 is mounted in the input section 28 so that its optical axes x1, y1 are at 45° angles to the transmission axis w1 and blocking axis z1 of the first polarization-dependent optical isolator 1.

Figure 34:
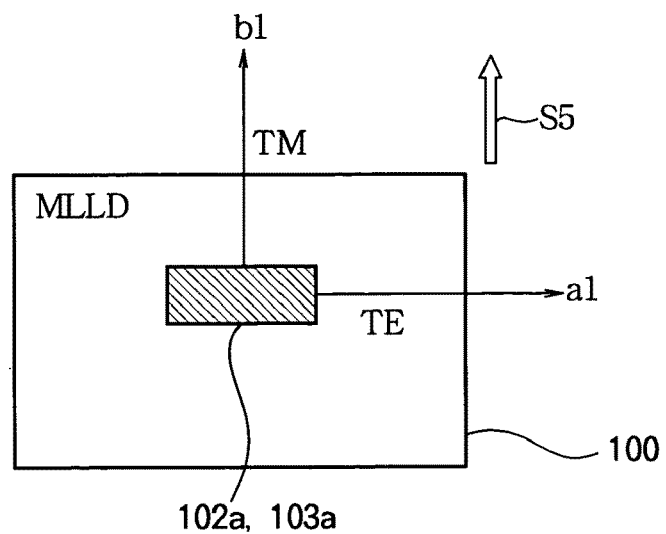
FIG. 34 illustrates the polarization direction of optical signal S5 in relation to optical axes of the mode-locked laser diode in FIG. 32.

FIG. 34 shows the TE polarization directional and the TM polarization direction b1 of the mode-locked laser diode 100. As in the first embodiment, the TE polarization directional matches the blocking axis z1 of the first polarization-dependent optical isolator 1 and the TM polarization axis b1 matches the transmission axis w1 of the first polarization-dependent optical isolator 1. FIGS. 33 and 34 also indicate the polarization directions of the optical signals S1 to S5 indicated in FIG. 32.

The operation of the fourth embodiment can be divided into two steps: a first step (A) of generating an optical signal S5 polarized in the TM direction from an input optical signal S0 polarized in an arbitrary direction, and a second step (B) of recovering an optical clock signal from optical signal S5.

In the first step, the input optical signal S0 enters the birefringent medium 10 and propagates as two perpendicularly polarized components, one component polarized parallel to the x1 axis, the other component polarized parallel to the y1 axis. The first component, parallel to the x1 axis, is output from the first polarization-dependent optical isolator 1 as optical signal S1; the second component, parallel to the y1 axis, is output from the first polarization-dependent optical isolator 1 as optical signal S2

Because of the birefringence of the birefringent medium 10, the optical signals S1, S2 experience different propagation delays in the birefringent medium 10, and emerge from the birefringent medium 10 out of phase with each other. The difference between the propagation delays is the differential group delay ΔT, also known in the optical communications field as the polarization mode dispersion.

The relative differential phase θ of the light waves in optical signals S1 and S2 is given by the formula:

$$\theta = (2\pi/\lambda_s)\Delta n L$$

where Δn is the birefringence magnitude, that is, the difference between the refractive index with respect to the ordinary ray and the refractive index with respect to the extraordinary ray, and L is the length of the birefringent medium 10.

The differential group delay ΔT is given by the formula:

$$\Delta T = (\Delta n/c) L$$

where c is the speed of light in a vacuum.

Since the differential group delay is an integer multiple of the bit period of the input optical signal S0, $$\Delta T = n \times T_{bit-rate}$$

where n is an integer greater than zero.

Specific examples of the design of the birefringent medium 10 will now be discussed. In the first example, the birefringent medium 10 comprises a length of polarization-maintaining and absorption-reducing fiber, generally known as PANDA fiber, which is widely used in the optical communication field.

In the 1.5-μm band, the birefringence Δn of PANDA fiber is typically about $3 \times 10^{-4}$. For optical fiber, this value is also referred to as the mode birefringence. The polarization mode dispersion of PANDA fiber is therefore about one picosecond per meter (1 ps/m). If the bit rate of the input optical signal is 40 Gb/s, the bit period $T_{bit-rate}$ is 25 ps. If the differential group delay is one bit period (n=1), the length of the PANDA fiber is 25 m. It is known that PANDA fiber can be wound on a bobbin about five centimeters (5 cm) in diameter with negligible degradation of its optical characteristics. The core diameter of PANDA fiber is about 400 μm. Adding 25 m of PANDA fiber to the apparatus accordingly does not increase its size so much as to cause problems, and since PANDA fiber is commercially available, its use does not significantly increase the manufacturing cost of the birefringent medium 10.

An optical crystal can also be used as the birefringent medium 10. Either a uniaxial crystal or a biaxial crystal may be used as the birefringent medium 10, provided its differential group delay is an integer multiple of the bit period. The greater the birefringence magnitude Δn of the optical crystal, the more compact the birefringent medium 10 can be. As a second example, the length L of a birefringent medium 10 made of yttrium vanadate ($YVO_4$), a material used in recent optical isolators for optical communication systems, will be estimated below.

At a wavelength of 1.55 μm, the refractive indexes of a $YVO_4$ crystal are 1.9447 for the ordinary ray and 2.1486 for the extraordinary ray. The birefringence magnitude Δn is the difference between these values: Δn=2.1486−1.9447=0.2039. If the input optical signal has a 40-Gb/s bit rate ($T_{bit-rate}$=25 ps) and the differential group delay is set at one bit period (n=1), then from the equations above, the length L of the $YVO_4$ crystal is 36.8 mm. This is only about 1/700 of the 25-m length of the PANDA fiber used in the first example. The size of the apparatus can accordingly be reduced by using a YVO₄ crystal instead of a PANDA fiber.

As the above equations show, as the bit rate increases and accordingly the bit period $T_{bit-rate}$ decreases, the necessary differential group delay $\Delta T$ also decreases. Since the contemplated uses of the invented optical clock signal recovery apparatus are in high-bit-rate optical communications, this is a favorable circumstance from the standpoint of industrial utility.

The optical signals S1, S2 that enter the first polarization-dependent optical isolator 1 are both polarized at 45° angles to the w1 axis, that is, to the direction of light that passes through the first polarization-dependent optical isolator 1, and also to the z1 axis, the polarization direction in which light is blocked. The combination of optical signals S1 and S2 can also be regarded as an optical signal having a component S3 polarized parallel to the z1 axis and an optical signal component S4 polarized parallel to the w1 axis. Only the S4 component passes through the first polarization-dependent optical isolator 1; the optical signal S5 output from the first polarization-dependent optical isolator 1 includes the S4 component but not the S3 component.

As shown in FIG. 34, optical signal S5 is polarized in the TM direction of the mode-locked laser diode 100, so when it is coupled into the L1 facet of the mode-locked laser diode 100 by the coupling lens 3, an optical clock signal is recovered as explained in the first embodiment, regardless of the polarization of the input optical signal S0.

To ensure that optical signal S5 enters the mode-locked laser diode 100 polarized in the TM direction, it suffices to construct the input section 28 as a polarization-maintaining optical system. This can be done by inserting a polarization controller (not shown) at some point in the optical path in the input section 28. This polarization controller only has to control the polarization of light passing through the birefringent medium 10, first polarization-dependent optical isolator 1, and coupling lens 2, which are mounted in fixed positions, so it only has to be adjusted in the manufacturing stage; then its crystal axes etc. can be left fixed. The polarization controller does not have to be adjusted constantly during use. Unlike the variable polarization controller recommended for use in the preceding embodiments, the polarization controller used in the third embodiment does not require electronic control circuits and does not consume power during use.

Although the fourth embodiment has been described as a modification of the first embodiment, it will be appreciated that the second and third embodiments can be similarly modified by adding a birefringent medium to ensure that an optical signal polarized in the TM direction and having sufficient energy for clock recovery reaches the mode-locked laser diode 100.

It remains to consider how the temporal waveform of optical signal S5 varies depending on the polarization of the input optical signal S0, and how this affects optical clock recovery.

Figure 35:
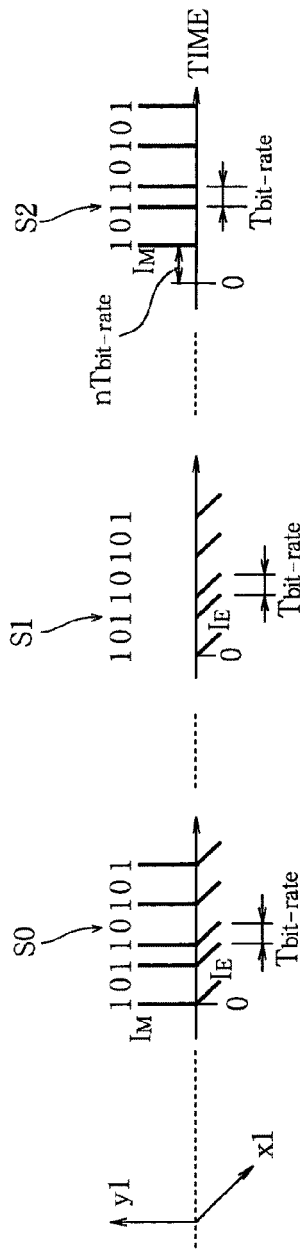
FIGS. 35 to 37 illustrate exemplary pulse trains and polarization directions of the optical signals in FIG. 32.

FIG. 35 illustrates an input optical signal S0 with arbitrary polarization, representing eight bits of binary data ('10110101'), and the optical signals S1, S2 exiting the birefringent medium 10, with '1' bits represented by pulses joined to the time axis and '0' bits represented by the absence of such pulses.

Even if the polarization of the input optical signal S0 is not aligned with any of the axes indicated in FIG. 33, it propagates through the birefringent medium 10 as if it comprised a component polarized parallel to the x1 axis and a component polarized parallel to the y1 axis, as indicated in FIG. 35. If the peak intensity of the '1' bits in the component polarized parallel to the x1 axis is $I_E$ and the peak intensity of the '1' bits in the component polarized parallel to the y1 axis is $I_M$, then the total intensity of the pulse is $I_E+I_M$. The polarization extinction ratio (PER) of this signal is defined as $I_E/I_M$. In FIG. 35, the polarization extinction ratio $I_E/I_M$ is greater than zero but less than one. The differential group delay is assumed to be twice the bit period $T_{bit-rate}$ (n=2).

Figure 36:
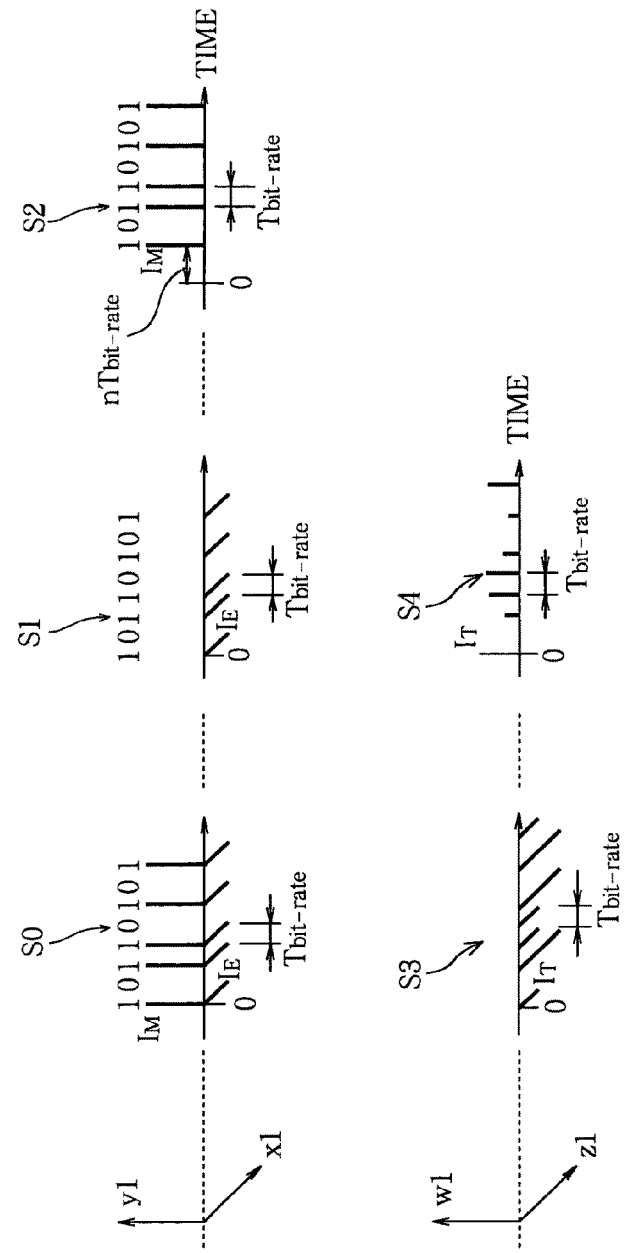

The optical signal that leaves the birefringent medium 10 is a combination of optical signals S1 and S2, which can also be regarded as a combination of the optical signals S3 and S4 in FIG. 36. Optical signal S3, polarized parallel to the z1 axis, receives contributions of different magnitudes from optical signals S1 and S2 and consists of pulses of various intensities, depending on whether the contributing bits in optical signals S1 and S2 are a '1' and '0', a '1' and a '1', or a '0' and a '1'. Optical signal S4, polarized parallel to the w1 axis, receives similar contributions from both optical signals S1 and S2.

Figure 37:
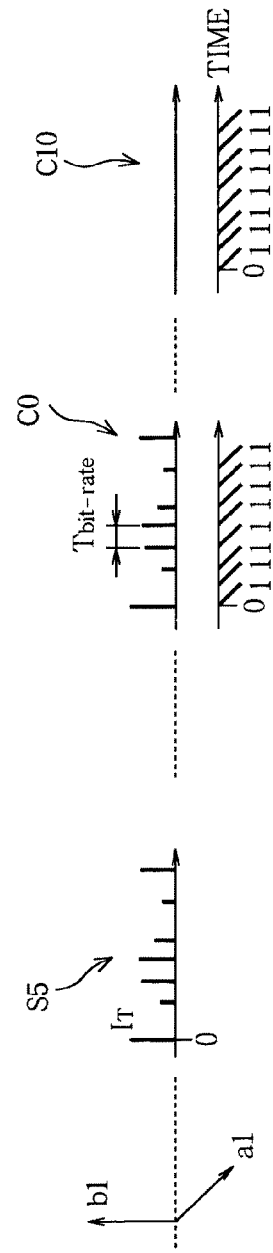

The optical signal S5 output from the first polarization-dependent optical isolator 1 and polarized parallel to the TM axis b1 of the mode-locked laser diode 100 is identical to the S4 component of the optical signal entering the first polarization-dependent optical isolator 1, as shown in FIG. 37. The optical pulse train signal C0 output from the mode-locked laser diode 100 includes both the TM polarized pulses of optical signal S5 and the TE polarized pulses of laser light generated by the mode-locked laser diode 100, which are polarized parallel to the a1 axis. Of these pulses, the TE polarized pulses pass through the second polarization-dependent optical isolator 4 and are output as the recovered optical clock signal C10.

Although optical signal S5 has a different pulse pattern from the input optical signal S0, because the differential group delay is an integer multiple of the bit period, all pulses in optical signal S5 are synchronized with the same clock phase and contribute to the recovery of a correctly-timed clock signal in the mode-locked laser diode 100.

Since the input optical signal S0 may be polarized in any direction, the polarization extinction ratio may have any value, and the relative differential phase φ may have any value from zero to 2π. (The polarization extinction ratio and relative differential phase determine the polarization state of the input optical signal S0.)

To recover an optical clock signal from an input optical signal S0 with an arbitrary polarization it is necessary for the temporal jitter of the recovered optical clock signal to remain below a predetermined level and not vary greatly with the polarization extinction ratio and relative differential phase.

The temporal waveform $I_{S0}(t)$ of the input optical signal can be defined as follows, where I(t) is a temporal intensity waveform function with a peak intensity normalized to unity.

$$I_{S0}(t)=(I_E/I_M)I(t)$$

The temporal waveforms $I_{S1}(t)$ and $I_{S2}(t)$ of the optical signals S1 and S2 output from the birefringent medium 10 can be expressed as follows.

$$I_{S1}(t)=I_E I(t)$$

$$I_{S2}(t)=I_M I(t-nT_{bit-rate})$$

The temporal amplitude waveforms of optical signals S1 and S2 can be expressed as follows, where j is the imaginary unit (square root of minus one).

$$\{I_E I(t)\}^{1/2}$$

$$\{I_M I(t-nT_{bit-rate})\}^{1/2} \exp(j(\phi+\theta))$$

Both components contribute to the optical signal component S4 polarized in the TM direction that passes through the first polarization-dependent optical isolator 1 to become the optical signal S5 input to the mode-locked laser diode 100. The waveform of optical signal S5 can be expressed as follows.

$$I_{S5}(t)=|-(\{I_E I(t)/2\}^{1/2}+\{I_M I(t-nT_{bit\text{-}rate})\}^{1/2}\exp(j(\phi+\theta)))|^2$$

In these equations, $\theta$ is the relative differential phase arising in the light waves as the optical signals pass through the birefringent medium 10, and since $\theta$ appears in the same term as the initial relative differential phase $\phi$ as part of a sum, in the following discussion there is no need to distinguish between variations in $\theta$ and variations in $\phi$. In other words, what is true of variations in the initial relative differential phase $\phi$ also applies to variations in $\theta$. The sum $\phi+\theta$ can also take arbitrary values from 0 to $2\pi$, and if stable optical clock signal recovery is ensured for all values of $\phi+\theta$, then the purpose of the fourth embodiment is achieved.

A condition for assuring stable optical clock signal recovery for arbitrary values of $\theta$ is that clock signal recovery must not require precise control of the length of the birefringent medium 10 by a high-precision control circuit or system so as to control the lightwave phase of the optical signals. The apparatus should be manufacturable at a low cost, without any such circuit or system.

In the following discussion of the temporal waveforms of optical signals S0 to S5, for simplicity, optical losses occurring in the birefringent medium 10 and first polarization-dependent optical isolator 1 for reasons other than polarization plane alignment will be ignored.

From the above equation for the temporal waveform $I_{S5}(t)$ of optical signal S5, the following conclusions (i)-(iii) can be drawn.

(i) If the differential group delay is zero (n=0), $I_E=I_M$ (PER=1), and $\phi+\theta=0$, then the contributions from optical signals S1 and S2 cancel out and $I_{S5}(t)=0$.

(ii) If the differential group delay is not zero (n≠0), then when optical signal S1 represents a '1' and optical signal S2 represents '0', optical signal S5 represents a '1' with a peak intensity $I_T$ of $I_E/2$. Conversely, when optical signal S1 represents '0' and optical signal S2 represents '1', optical signal S5 represents '1' with a peak intensity $I_T$ of $I_M/2$. When optical signals S1 and S2 both represent '0', optical signal S5 also represents '0'. When optical signals S1 and S2 both represent '1', optical signal S5 represents '1' with a peak intensity $I_T$ of $(I_E/2)+(I_M/2)-(I_E I_M)^{1/2}\cos(\phi+\theta)$. In the particular case in which optical signals S1 and S2 both represent '1', $I_E=I_M$ (PER=1), and $\phi+\theta=0$, however, optical signals S5 represents '0'.

(iii) The parameter n must be an integer greater than zero; it must not be a rational number such as ½ or an irrational number such as $2^{1/2}$. If n is an integer greater than zero, then even if the polarization extinction ratio (PER) or the value of ($\phi+\theta$) changes, optical signal S5 will consist of optical pulses spaced at integer multiples of the bit period $T_{bit\text{-}rate}$ on the time axis, enabling an optical clock signal to be recovered. If n is not an integer greater than zero, then depending on the polarization extinction ratio (PER) and the phase value ($\phi+\theta$), the optical pulses constituting optical signal S5 will be spaced irregularly on the time axis, not at integer multiples of the bit period $T_{bit\text{-}rate}$, and as a result, the recovered optical clock signal will include temporal offsets (phase offsets) that depend on PER and ($\phi+\theta$).

If there is no differential group delay, $I_E=I_M$ (PER=1), and $\phi+\theta=0$, then optical signal S5 disappears completely, and since no signal is input to the mode-locked laser diode 100, no clock signal is recovered. To avoid this state, optical signals S1 and S2 should have a differential group delay of several bit periods.

To prevent a phase offset in the recovered optical clock signal, the differential group delay must be an integer multiple of the bit period ($T_{bit\text{-}rate}$).

Conclusion (ii) above implies that the pulse intensity or level in optical signal S5 may vary from pulse to pulse, as illustrated in FIG. 37. The average level of optical signal S5 also varies over time. These level variations depend on the polarization extinction ratio (PER) and the phase parameters $\phi$ and $\theta$, but regardless of these variations, optical signal S5 will still have pulses in the right places for recovery of a correctly-timed optical clock signal.

It follows that for stable optical clock signal recovery, the optical clock signal recovery mechanism in the mode-locked laser diode 100 (a) must be able to absorb variations in the peak intensity of the input optical pulses, and (b) must have a margin with respect to fluctuations in the average intensity of the input optical signal adequate to keep clock jitter at a low enough level for practical use.

The first requirement (a) was studied in the article 'Retiming and Reshaping Function of All-Optical Clock Extraction at 160 Gb/s in Monolithic Mode-Locked Laser Diode' by Arahira (the present inventor) and Ogawa cited above. The experiments reported in FIGS. 9 and 10 in that article showed that an optical clock signal with sufficiently small intensity fluctuations and temporal jitter could be recovered from an optical signal including ±25% intensity noise input to a mode-locked laser diode.

The experiments described below indicate that a mode-locked laser diode with the ability to absorb variations in the peak intensity of input optical pulses (intensity noise) reported by Arahira and Ogawa is adequate for recovery of an optical clock signal in the apparatus of the fourth embodiment; that is, the variations in peak intensity level of optical signal S5 can be adequately absorbed and do not cause problems in practice.

To study the second requirement (b) above, the inventor estimated the amount of variation in the average intensity level of optical signal S5 as a function of the polarization extinction ratio (PER) of the input optical signal S0 and the phase value ($\phi+\theta$). These estimates assumed that the signal pattern of the input optical signal S0 was a pseudo-random pattern of the type generally used for evaluating optical communication systems. Table 1 lists the signal pattern used: a seventh-order pseudo-random pattern with a repeating period of 127 bits ($2^7-1$ bits), including sixty-four '1' bits and sixty-three '0' bits. If the energy of each optical pulse is set equal to unity, the normalized average intensity of the input optical signal S0 is 64.

TABLE 1

| Bit Numbers | Signal Pattern |
|---|---|
| 1 to 16 | 1111111000000100 |
| 17 to 32 | 0001100001010001 |
| 33 to 48 | 1110010001011001 |
| 49 to 64 | 1101010011111010 |
| 65 to 80 | 0001110001001001 |
| 81 to 96 | 1011010110111101 |
| 97 to 112 | 1000110100101110 |
| 113 to 127 | 111001100101010 |

Figure 38:
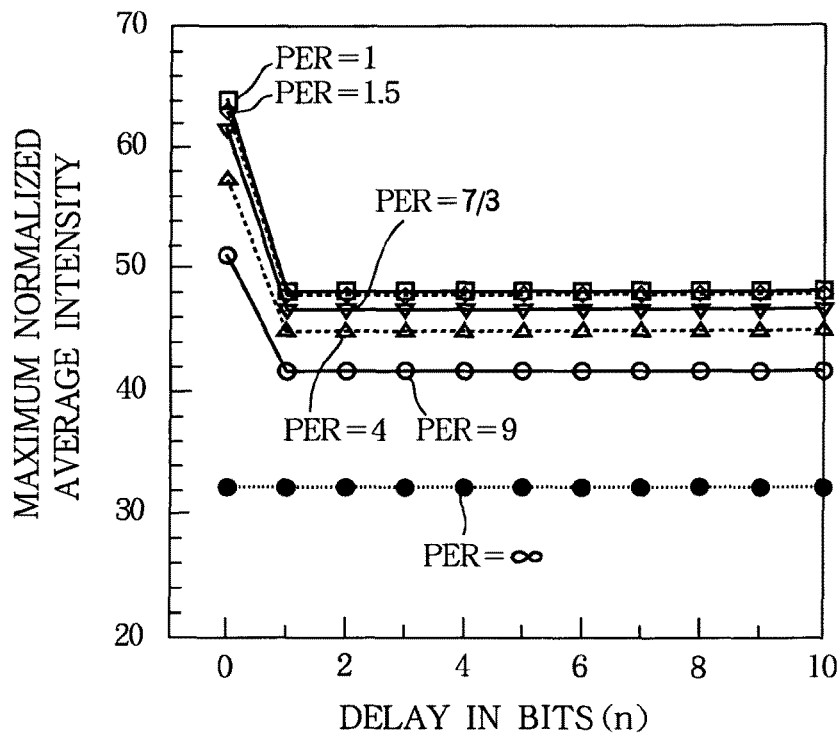
FIGS. 38 and 39 illustrate calculated maximum and minimum average levels of optical signal S5 in FIG. 32 as functions of the differential group delay and polarization extinction ratio.
Figure 39:
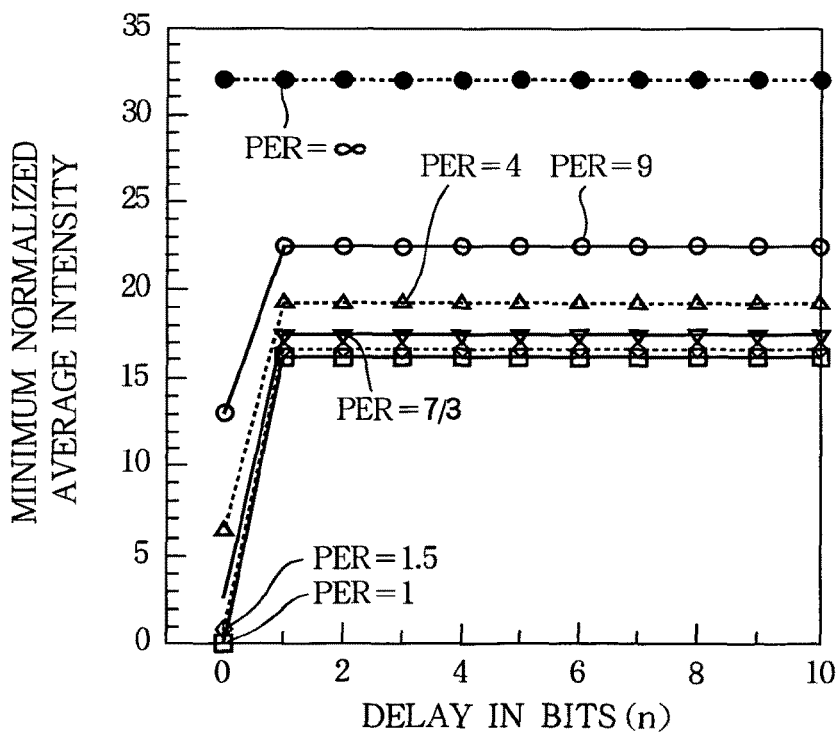

FIGS. 38 and 39 illustrate the calculated PER dependency of the maximum and minimum normalized average intensity of optical signal S5 with respect to the differential group delay between optical signals S1 and S2 expressed as a relative bit delay (n). The relative bit delay (n) is shown on the horizontal axis, the maximum normalized average intensity of optical signal S5 is shown on the vertical axis in FIG. 38, and the minimum normalized average intensity of optical signal S5 is shown on the vertical axis in FIG. 39. The maximum and minimum values are the maximum and minimum values calculated for varying values of the phase (φ+θ). Calculated curves are shown for different values of the polarization extinction ratio (PER).

When there is no relative bit delay between optical signals S1 and S2 (n=0), the maximum normalized average intensity is 64 and the minimum normalized average intensity is zero. The maximum value occurs when PER=1 and (φ+θ)=π, causing the optical signals S1 and S2 to interfere constructively. The minimum value occurs when PER=1 and (φ+θ)=0, causing optical signals S1 and S2 to interfere destructively. These results will be excluded from the following discussion, because in the present embodiment the relative bit delay is never zero.

When the relative bit delay is non-zero (n≠0), the minimum normalized average intensity is 16, as shown in FIG. 39, and the maximum normalized average intensity is 48, three times larger than the minimum value, as shown in FIG. 38. The maximum value occurred when PER=1 and (φ+θ)=0. The minimum value occurred when PER=1 and (φ+θ)=π. For each PER value, the maximum and minimum normalized average intensities were the same for all non-zero relative bit delays (all n greater than zero). This lack of dependence on the relative bit delay is thought to be a result of the features of the pseudo-random signal pattern used in the calculations.

From the above discussion, it follows that the optical signal S5 input to the mode-locked laser diode 100 has an average intensity level that may vary by a factor of three (approximately 4.8 dB), depending on the polarization state of the input optical signal S0. Accordingly, if the optical clock signal recovery operation has a margin of at least 4.8 dB with respect to the average input intensity of the optical signal input to the mode-locked laser diode, an optical clock signal can be recovered by the apparatus in the second embodiment. In other words, if the mode-locked laser diode 100 has a margin of at least 4.8 dB with respect to the average input intensity of its optical input signal, a stable optical clock signal C10 can be recovered with low jitter, regardless of variations in the polarization state of the input optical signal S0.

The recovered optical clock signal C10 is obtained by passing the optical pulse train C0 output from the right facet R1 of the mode-locked laser diode 100 through the coupling lens 3 and second polarization-dependent optical isolator 4. As already explained in the first three embodiments, the recovered optical clock signal C10 is obtained regardless of the wavelength of the input optical signal S0, and does not contain any input optical signal components. Provided the input optical signal has a wavelength within the range in which absorption saturation occurs in the saturable absorption region, the optical clock signal is recovered without variations in temporal jitter, optical pulse width, and wavelength spectrum characteristics.

Experiments carried out to verify the effect of the fourth embodiment will now be described. The same mode-locked laser diode 100 was used as in the first embodiment.

Mode-locked operation was observed when 140 mA of direct current was injected into the gain region and the saturable absorption region was reverse-biased at −1.09 V. The width of the optical pulses in the mode-locked pulse train output from the laser was 3.94 ps, the center wavelength was 1552 nm (more precisely, 1551.54 nm), and the half-power width of the wavelength spectrum was 0.82 nm. The repetition frequency of the mode-locked pulse train output from the laser was 39.815 GHz. The average optical intensity of the optical pulse train component output from the facet L1 adjacent the saturable absorption region and coupled into the optical fiber was approximately 1.60 dBm. The loss at the optical coupling into the fiber was about 5 dB.

A pseudo-random optical signal of order 31 (repeating after $2^{31}-1$ bits) with a bit rate of 39.81312 Gb/s, an optical pulse width of 4 ps to 6 ps, and an RZ format was used as the input optical signal. The input optical signal was generated by use of a variable-wavelength semiconductor laser and two electro-absorption (EA) modulators. One of the EA modulators was used to generate an optical pulse train; the other was used to generate the pseudo-random optical signal. In the experiments, the wavelength of the variable-wavelength semiconductor laser was varied to evaluate the effects on the characteristics of the recovered optical clock signal.

The experiments were carried out with an optical clock signal recovery apparatus of the type shown in FIG. 4 in the second embodiment but including a birefringent medium mounted in front of the polarization-dependent optical circulator 5. The input optical signal was fed through the birefringent medium, polarization-dependent optical circulator 5 and Faraday rotator 6 into the facet L1 of the mode-locked laser diode 100 adjacent the saturable absorption region. The optical pulse train output from the same facet L1 was returned through the Faraday rotator 6 to the polarization-dependent optical circulator 5 and output as the recovered optical clock signal.

A commercially available PANDA fiber approximately 19.5 m long was used as the birefringent medium in these experiments. The differential group delay ΔT was approximately 25.1 ps, equivalent to a one-bit delay at the 39.81312-Gb/s bit rate of the input optical signal.

For comparison, the input optical signal was also input as-is to the mode-locked laser diode 100 without using a birefringent medium, and the recovered optical clock signal was evaluated. In this comparative experiment, a polarization-independent optical circulator was employed, so that the optical signal could be input with an arbitrary polarization.

Figure 40:
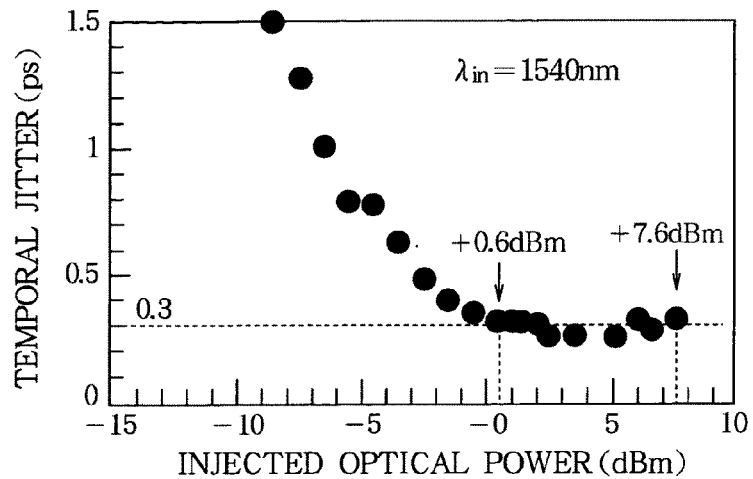
FIGS. 40 to 42 illustrate temporal jitter of the recovered optical clock signal in FIG. 32 as a function of the strength of the input optical signal.
Figure 41:
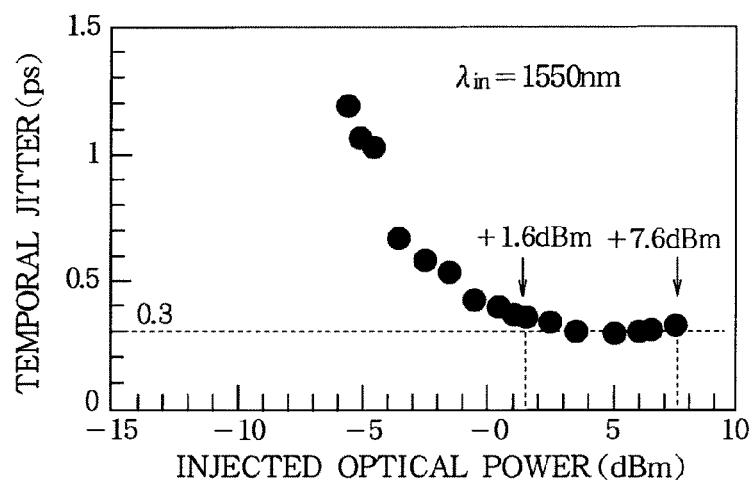
Figure 42:
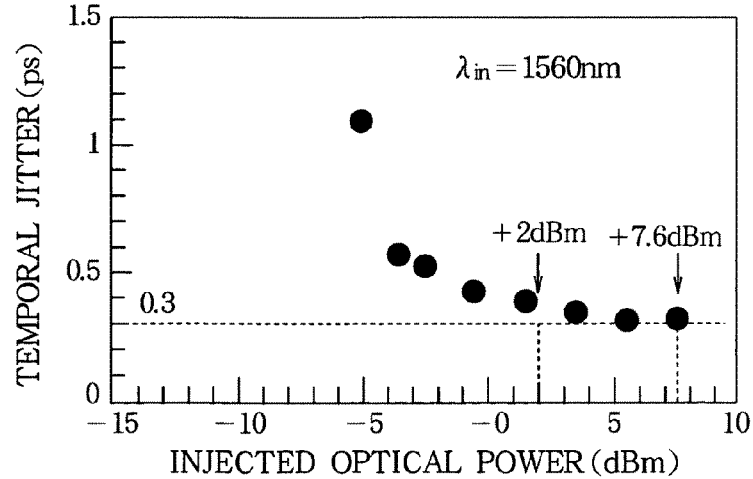

First, the optical clock signal recovery margin with respect to the intensity of the input optical signal was evaluated. In this evaluation, the input optical signal had a fixed TM polarization. The experimental results are shown by the graphs in FIGS. 40, 41, and 42. In each graph, the injected optical power is shown in dBm on the horizontal axis, and temporal jitter is shown in picoseconds (ps) on the vertical axis. The wavelength of the input optical signal was 1540 nm in FIG. 40, 1550 nm in FIG. 41, and 1560 nm in FIG. 42.

At all three input wavelengths, jitter decreased as the input optical power increased to 0 dBm, but then stabilized at about 0.3 ps at a point above 0 dBm. For an input wavelength $\lambda_{in}$ of 1540 nm, substantially constant 0.3-ps jitter was measured from +0.6 dBm to +7.6 dBm (a range of 7.0 dB); for a 1550-nm input wavelength, substantially constant jitter was measured from +1.6 dBm to +7.6 dBm (a range of 6.0 dB); for a 1560-nm input wavelength, substantially constant jitter was measured from +2.0 dBm to +7.6 dBm (a range of 5.6 dB). All of these ranges are wider than the 4.8-dB margin calculated to be necessary for stable clock recovery in the fourth embodiment, demonstrating that the varying level of optical signal S5 in the fourth embodiment does not pose practical problems for clock recovery.

Figure 43:
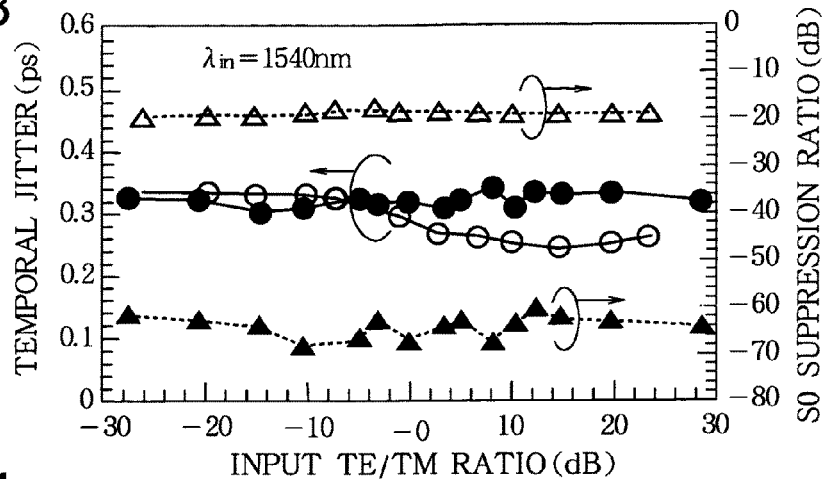
FIGS. 43 to 45 illustrate temporal jitter and the input optical signal suppression ratio of the optical clock signal recovery apparatus in FIG. 32 with and without the birefringent medium, as a function of the polarization ratio of the input optical signal.
Figure 44:
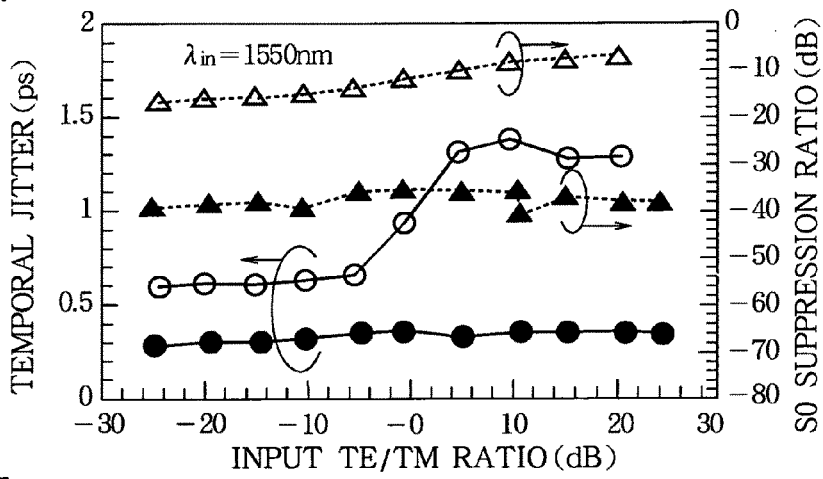
Figure 45:
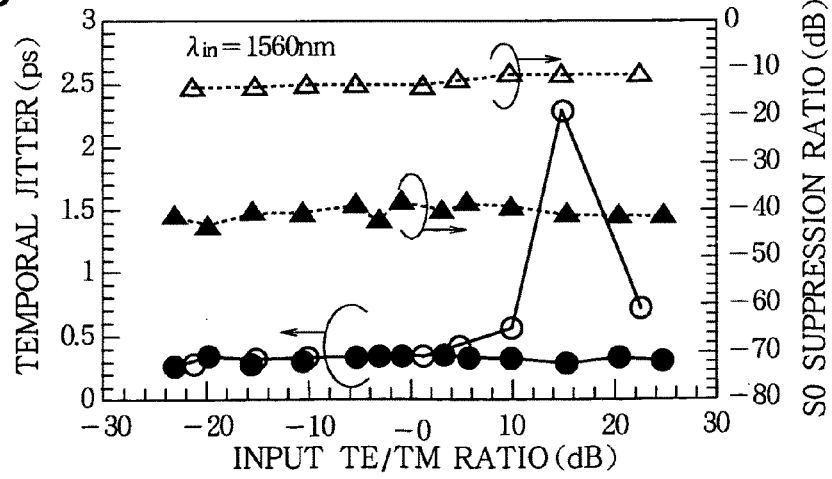

Next, temporal jitter of the recovered optical clock signal and the input optical signal suppression ratio were evaluated as the ratio of the TE and TM polarized components of the input optical signal was varied. The results are shown in FIGS. 43, 44, and 45 for input wavelengths of 1540 nm, 1550 nm, and 1560 nm, respectively. The TE/TM ratio of the input optical signal is shown in decibels (dB) on the horizontal axis, optical jitter is shown in picoseconds (ps) on the left vertical axis, and the input optical signal (S0) suppression ratio is shown in decibels (dB) on the right vertical axis. The data points indicated by circles are temporal jitter values. The data points indicated by triangles are input optical signal suppression ratio values. White circles and triangles indicate data obtained with no birefringent medium inserted. Black circles and triangles indicate data obtained with the birefringent medium described above.

As shown in FIG. 43, when the input wavelength was 1540 nm, temporal jitter varied only slightly with variations in the input optical signal suppression ratio, and was substantially the same regardless of whether the birefringent medium was inserted or not. The reason is that at a wavelength of 1540 nm, the optical gain of the gain region of the mode-locked laser diode 100 was low, and the optical absorption of the saturable absorption region was high, suppressing optical resonance effects. The tensile strain of the quantum well structure in the saturable absorption region also suppressed the polarization dependency of the modulation of the optical absorption coefficient by the input optical signal.

When the birefringent medium was not inserted, however, suppression of the input optical signal component in the recovered optical clock signal was only −14 dB, indicating the need for a separate wavelength filter to obtain a distortion-free recovered optical clock signal. When the birefringent medium was inserted, the input optical signal suppression ratio was about −50 dB, adequate to yield a distortion-free recovered optical clock signal without a separate wavelength filter.

At input wavelengths of 1550 nm and 1560 nm, the effect of the birefringent medium became clearer. As shown in FIGS. 44 and 45, without a birefringent medium inserted, temporal jitter depended on the TE/TM polarization ratio of the input optical signal, increasing to high values when the input optical signal was polarized predominantly in the TE direction and was able to cause multiple modulation effects and optical injection locking because its predominant polarization matched the polarization of the laser light. In addition, the input optical signal suppression ratio was only about −10 dB to −15 dB, indicating the need for a separate wavelength filter.

In contrast, when the birefringent medium was inserted, optical jitter remained substantially constant at about 0.3 ps and the input optical signal suppression ratio remained substantially constant at about −40 dB, regardless of the TE/TM polarization ratio of the input optical signal, indicating that a low-jitter, low-distortion recovered optical clock signal could be obtained without a separate wavelength filter.

Figure 46:
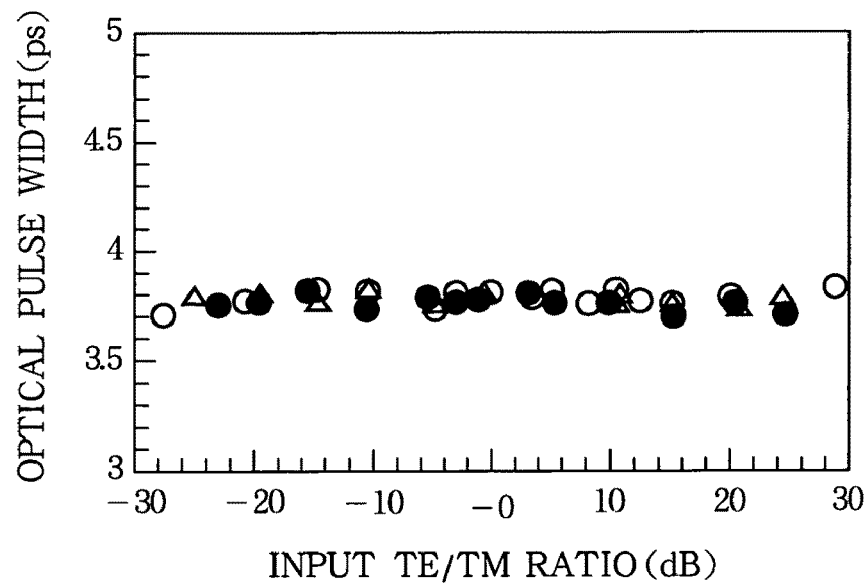
FIGS. 46 and 47 illustrate the optical pulse width and wavelength spectral width of the recovered optical clock signal in FIG. 32 as functions of the polarization ratio of the input optical signal.
Figure 47:
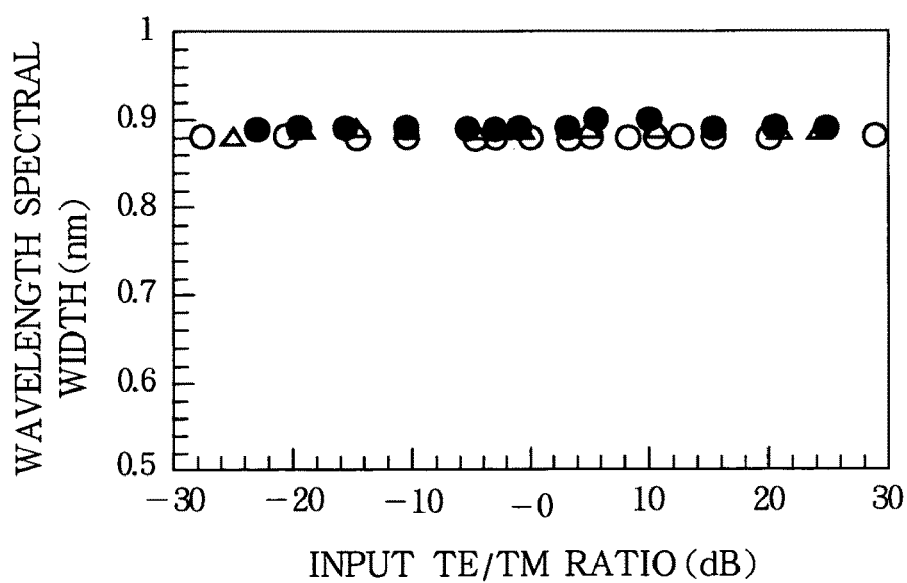

The graphs in FIGS. 46 and 47 illustrate further characteristics of the recovered optical clock signal in the fourth embodiment. In both graphs the TE/TM polarization ratio of the input optical signal is shown in decibels (dB) on the horizontal axis. The optical pulse width of the recovered optical clock signal is shown in picoseconds on the vertical axis in FIG. 46; the wavelength spectral width of the recovered optical clock signal is shown in nanometers on the vertical axis in FIG. 47.

The data shown in FIGS. 46 and 47 indicate that as the TE/TM polarization ratio of the input optical signal varied, both the optical pulse width and wavelength spectral width of the recovered optical clock signal remained substantially constant, showing that optical clock signal recovery was stable and did not depend on the TE/TM polarization ratio of the input optical signal.

The results of these experiments show that the fourth embodiment, besides providing the effects of the first three embodiments, is capable of stable optical clock signal recovery regardless of the polarization state of the input optical signal.

Although the above embodiments have been described as using a passive mode-locked laser diode 100 in which the saturable absorption region operates as a mode locker, the invention is not limited to this type of mode-locked semiconductor laser. Even if a semiconductor laser lacks a saturable absorption region, if the input of an optical signal causes a modulation of the optical gain, optical absorption, or refractive index of a gain region disposed near the input facet, and thereby causes the semiconductor laser to emit pulses of laser light at a repetition rate locked to the bit rate of the input optical signal, the semiconductor laser can be used in an optical clock signal recovery apparatus having an optical input-output section, or optical input and output sections, according to the present invention.

More generally, the present invention provides a method of recovering an optical clock signal by providing a mode-locked semiconductor laser with an input optical signal polarized in a plane perpendicular to the plane of polarization of the laser light generated by the mode-locked semiconductor laser, thereby causing the mode-locked semiconductor laser to generate and output an optical pulse train, and passing the optical pulse train through an optical component that passes only light polarized in the plane in which the laser light is polarized.

Those skilled in the art will recognize that this method can be carried out by any apparatus falling within the scope of the invention, which is defined in the appended claims, and is not limited to the embodiments above.

What is claimed is:

1. An optical clock signal recovery apparatus comprising:
a mode-locked semiconductor laser for emitting an optical pulse train polarized in a first direction, the mode-locked semiconductor laser having a first end, a second end, a gain region disposed between the first end and the second end for amplifying light by stimulated emission of radiation, and a saturable absorption region disposed between the first end and the gain region for saturably absorbing the light; and
an optical section for receiving an input optical signal, feeding a component of the input optical signal polarized in a second direction into the first end of the mode-locked semiconductor laser, transmitting the optical pulse train emitted by the mode-locked semiconductor laser for output as a recovered optical clock signal, and blocking light output from the mode-locked semiconductor laser polarized in the second direction, the second direction being perpendicular to the first direction.

2. The optical clock signal recovery apparatus of claim 1, wherein the gain region comprises a semiconductor active layer with an unstrained quantum structure or a compressively strained quantum structure.

3. The optical clock signal recovery apparatus of claim 2, wherein the saturable absorption region comprises a bulk semiconductor active layer.

4. The optical clock signal recovery apparatus of claim 2, wherein the saturable absorption region comprises a semiconductor active layer with a tensile strained quantum structure.

5. The optical clock signal recovery apparatus of claim 1, wherein the mode-locked semiconductor laser emits the optical pulse train from the second end.

6. The optical clock signal recovery apparatus of claim 1, wherein the optical section comprises:
- an optical input section disposed adjacent the first end of the mode-locked semiconductor laser for receiving the input optical signal, the optical input section including a first polarization-dependent optical isolator for transmitting light polarized in the second direction toward the first end of the mode-locked semiconductor laser, blocking light polarized in the first direction, and blocking light emitted from the first end of the mode-locked semiconductor laser; and
- an optical output section disposed adjacent the second end of the mode-locked semiconductor laser for output of the recovered optical clock signal, the optical output section including a second polarization-dependent optical isolator for transmitting light polarized in the first direction from the second end of the mode-locked semiconductor laser, blocking light polarized in the second direction, and blocking light propagating toward the second end.

7. The optical clock signal recovery apparatus of claim 1, wherein the mode-locked semiconductor laser emits the optical pulse train from the first end, the optical section being disposed adjacent the first end.

8. The optical clock signal recovery apparatus of claim 7, wherein the optical section includes:
- a polarization-dependent optical circulator having a first port for receiving the input optical signal, a second port optically coupled to the first end of the mode-locked semiconductor laser, and a third port for output of the recovered optical clock signal, the polarization-dependent optical circulator being operable to transmit light polarized in a third direction from the first port to the second port, transmit light polarized in the third direction from the second port to the third port, and block light polarized in a fourth direction, the third direction being disposed at a forty-five degree angle to the first direction, the fourth direction being perpendicular to the third direction; and
- a Faraday rotator inserted between the second port of the polarization-dependent optical circulator and the first end of the mode-locked semiconductor laser, for transmitting light between the second port of the polarization-dependent optical circulator and the first end of the mode-locked semiconductor laser with a forty-five degree rotation of polarization.

9. The optical clock signal recovery apparatus of claim 7, wherein the optical section includes:
- an optical coupler having a first port, a second port, a third port, and a fourth port, for transmitting light from the first port to the second port and the third port, and transmitting light from the third port to the first port and the fourth port, the third port being optically coupled to the first end of the mode-locked semiconductor laser;
- a first polarization-dependent optical isolator for receiving the input optical signal, transmitting light polarized in the first direction to the first port of the optical coupler, blocking light polarized in the second direction, and blocking light emitted from the first port of the optical coupler; and
- a second polarization-dependent optical isolator for transmitting light polarized in the second direction from the fourth port of the optical coupler, blocking light polarized in the first direction, and blocking light propagating toward the fourth port of the optical coupler.

10. The optical clock signal recovery apparatus of claim 9, wherein the second port of the optical coupler is optically terminated.

11. The optical clock signal recovery apparatus of claim 7, wherein the second end of the mode-locked semiconductor laser has a reflective coating.

12. The optical clock signal recovery apparatus of claim 1, wherein input optical signal has a predetermined bit rate and a bit period equal to a reciprocal of the predetermined bit rate, and the optical section includes a birefringent medium for dividing the input optical signal into two mutually perpendicularly polarized components with a differential group delay equal to a non-zero integer multiple of the bit period.

13. The optical clock signal recovery apparatus of claim 12, wherein the birefringent medium comprises a birefringent optical crystal.

14. The optical clock signal recovery apparatus of claim 12, wherein the birefringent medium comprises a polarization-maintaining and absorption-reducing fiber.

15. The optical clock signal recovery apparatus of claim 12, wherein the birefringent medium has a birefringence $\Delta n$ and a length L, and the differential group delay is equal to $(\Delta n/c)L$, where c is the speed of light in a vacuum.

16. A method of recovering an optical clock signal from an input optical signal, comprising:
- transmitting a component of the input optical signal polarized in a second direction into a mode-locked semiconductor laser that generates an optical pulse train polarized in a first direction, the first direction and the second direction being mutually perpendicular;
- blocking a component of the input optical signal polarized in the first direction;
- transmitting light exiting the mode-locked semiconductor laser polarized in the first direction, the transmitted light including the optical pulse train generated by the mode-locked semiconductor laser, the transmitted light becoming the optical clock signal; and
- blocking light exiting the mode-locked semiconductor laser polarized in the second direction.

17. The method of claim 16, wherein transmitting the component of the input optical signal polarized in the second direction includes transmitting the input optical signal through a first polarization-dependent optical isolator that blocks the component polarized in the first direction, and transmitting the light exiting the mode-locked semiconductor laser includes transmitting the light exiting the mode-locked semiconductor laser through a second polarization-dependent optical isolator that blocks the light polarized in the second direction.

18. The method of claim 16, wherein transmitting the component of the input optical signal polarized in the second direction includes transmitting the input optical signal through a polarization-dependent optical circulator to a Faraday rotator and through the Faraday rotator to the mode-locked semiconductor laser, and transmitting the light exiting the mode-locked semiconductor laser includes transmitting the light exiting the mode-locked semiconductor laser through the Faraday rotator to the polarization-dependent optical circulator.

19. The method of claim 16, wherein the input optical signal has a predetermined bit rate and a bit period equal to a reciprocal of the predetermined bit rate, and the method further includes passing the input optical signal through a birefringent medium that divides the input optical signal into two mutually perpendicularly polarized components with a differential group delay equal to a non-zero integer multiple of the bit period.

* * * * *